(12) United States Patent
Sherazi et al.

(10) Patent No.: US 10,833,161 B2
(45) Date of Patent: Nov. 10, 2020

(54) SEMICONDUCTOR DEVICE AND METHOD

(71) Applicants: IMEC VZW, Leuven (BE); GLOBALFOUNDRIES INC., Grand Cayman (KY)

(72) Inventors: Syed Muhammad Yasser Sherazi, Leuven (BE); Julien Ryckaert, Schaerbeek (BE); Juergen Boemmels, Heverlee (BE); Guillaume Bouche, Brussels (BE)

(73) Assignees: IMEC VZW, Leuven (BE); GLOBALFOUNDRIES INC., George Town (KY)

( * ) Notice: Subject to any disclaimer, the term of this patent is extended or adjusted under 35 U.S.C. 154(b) by 0 days.

(21) Appl. No.: 16/253,321

(22) Filed: Jan. 22, 2019

(65) Prior Publication Data

US 2019/0229196 A1 Jul. 25, 2019

(30) Foreign Application Priority Data

Jan. 22, 2018 (EP) .................................... 18152779

(51) Int. Cl.
*H01L 29/417* (2006.01)
*H01L 29/78* (2006.01)
(Continued)

(52) U.S. Cl.
CPC .. *H01L 29/41791* (2013.01); *H01L 21/31116* (2013.01); *H01L 21/76802* (2013.01);
(Continued)

(58) Field of Classification Search
CPC ..... H01L 21/823431; H01L 21/823475; H01L 29/41781; H01L 29/66795; H01L 29/785;
(Continued)

(56) References Cited

U.S. PATENT DOCUMENTS 9,281,379 B1 * 3/2016 Campi, Jr. ............ B32B 27/308
9,673,100 B2 * 6/2017 Hung ................ H01L 21/82343
(Continued)

FOREIGN PATENT DOCUMENTS

EP         3 514 833       * 7/2019   .......... H01L 29/417

OTHER PUBLICATIONS

European Search Report, European Patent Application No. 18152779.7, dated Aug. 23, 2018, 10 pages.
(Continued)

*Primary Examiner* — Mary A Wilczewski
(74) *Attorney, Agent, or Firm* — McDonnell Boehnen Hulbert & Berghoff LLP

(57) ABSTRACT

A semiconductor device includes: (i) a substrate; (ii) a first elongated semiconductor structure extending in a first horizontal direction along the substrate and protruding vertically above the substrate, wherein a first set of source/drain regions are formed on the first semiconductor structure; (iii) a second elongated semiconductor structure extending along the substrate in parallel to the first semiconductor structure and protruding vertically above the substrate, wherein a second set of source/drain regions are formed on the second semiconductor structure; and (iv) a first set of source/drain contacts formed on the first set of source/drain regions, wherein a first source/drain contact of the first set of source/drain contacts includes: (a) a vertically extending contact portion formed directly above a first source/drain region of the first set of source/drain regions, and (b) a via landing portion protruding horizontally from the vertically extending contact portion in a direction towards the second semiconductor structure.

20 Claims, 17 Drawing Sheets

(51) Int. Cl.

| | | |
|---|---|---|
| *H01L 21/311* | (2006.01) | |
| *H01L 21/768* | (2006.01) | |
| *H01L 21/8234* | (2006.01) | |
| *H01L 27/088* | (2006.01) | |
| *H01L 23/522* | (2006.01) | |
| *H01L 29/08* | (2006.01) | |
| *H01L 29/66* | (2006.01) | |

(52) U.S. Cl.
CPC .......... *H01L 21/76877* (2013.01); *H01L 21/823431* (2013.01); *H01L 21/823475* (2013.01); *H01L 23/5226* (2013.01); *H01L 27/0886* (2013.01); *H01L 29/0847* (2013.01); *H01L 29/66545* (2013.01); *H01L 29/66795* (2013.01); *H01L 29/7851* (2013.01); *H01L 21/823437* (2013.01); *H01L 29/6656* (2013.01); *H01L 29/785* (2013.01); *H01L 29/7848* (2013.01); *H01L 2029/7858* (2013.01)

(58) Field of Classification Search
CPC .......... H01L 29/7858; H01L 21/31116; H01L 21/76802; H01L 21/76877; H01L 21/823437; H01L 29/0847; H01L 29/41791; H01L 29/66545; H01L 29/6656; H01L 29/7848; H01L 29/7851; H01L 2029/7858; H01L 27/0886; H01L 23/5226

See application file for complete search history.

(56) References Cited

U.S. PATENT DOCUMENTS

| | | | | |
|---|---|---|---|---|
| 9,716,158 | B1* | 7/2017 | Cheng | H01L 29/4991 |
| 9,741,615 | B1* | 8/2017 | Zang | H01L 27/0886 |
| 9,741,812 | B1* | 8/2017 | Adusumilli | H01L 23/485 |
| 9,754,822 | B1* | 9/2017 | Chou | H01L 23/5283 |
| 9,837,539 | B1* | 12/2017 | Chen | H01L 21/76877 |
| 9,911,736 | B1* | 3/2018 | Zang | H01L 29/66545 |
| 9,922,882 | B1* | 3/2018 | Hung | H01L 21/823475 |
| 9,929,091 | B2* | 3/2018 | Li | H01L 23/5256 |
| 9,929,157 | B1* | 3/2018 | Xie | H01L 27/0886 |
| 9,941,277 | B2* | 4/2018 | Yoon | H01L 27/0886 |
| 10,008,497 | B2* | 6/2018 | Lee | H01L 21/02532 |
| 10,115,723 | B2* | 10/2018 | Xu | H01L 27/0924 |
| 10,153,373 | B2* | 12/2018 | Chen | H01L 21/823475 |
| 10,236,215 | B1* | 3/2019 | Xie | H01L 23/528 |
| 10,276,662 | B2* | 4/2019 | Lin | H01L 21/76897 |
| 10,347,726 | B2* | 7/2019 | Bae | H01L 29/785 |
| 2015/0357282 | A1 | 12/2015 | Lau et al. | |
| 2016/0056083 | A1* | 2/2016 | Do | H01L 29/41758 438/299 |
| 2016/0099211 | A1* | 4/2016 | Baek | H01L 27/1211 257/774 |
| 2016/0284700 | A1* | 9/2016 | Yoon | H01L 29/7848 |
| 2016/0372414 | A1 | 12/2016 | Song et al. | |
| 2017/0125414 | A1* | 5/2017 | Greene | H01L 21/30604 |
| 2017/0125543 | A1* | 5/2017 | Greene | H01L 21/30604 |
| 2017/0133367 | A1* | 5/2017 | Baek | H01L 27/1104 |
| 2017/0179120 | A1* | 6/2017 | Cheng | H01L 29/41791 |
| 2017/0186744 | A1* | 6/2017 | Moon | H01L 29/0649 |
| 2017/0194211 | A1* | 7/2017 | Lai | H01L 29/41791 |
| 2017/0212545 | A1* | 7/2017 | Lin | G05F 1/595 |
| 2017/0221891 | A1* | 8/2017 | Chen | H01L 23/485 |
| 2017/0229454 | A1* | 8/2017 | Chang | H01L 21/82347 |
| 2017/0309625 | A1* | 10/2017 | Kim | H01L 21/823437 |
| 2017/0317076 | A1* | 11/2017 | Shen | H01L 29/0847 |
| 2017/0317079 | A1* | 11/2017 | Kim | H01L 29/66636 |
| 2017/0345759 | A1* | 11/2017 | Lin | H01L 29/66795 |
| 2017/0352662 | A1* | 12/2017 | Xu | H01L 29/66803 |
| 2017/0352664 | A1* | 12/2017 | Yoon | H01L 21/823821 |
| 2018/0047634 | A1* | 2/2018 | Jun | H01L 29/66545 |
| 2018/0061757 | A1* | 3/2018 | Li | H01L 27/0617 |
| 2018/0061759 | A1* | 3/2018 | Li | H01L 29/785 |
| 2018/0069009 | A1* | 3/2018 | Chi | H01L 23/535 |
| 2018/0096935 | A1* | 4/2018 | Kim | H01L 27/1211 |
| 2018/0151718 | A1* | 5/2018 | Chen | H01L 21/823871 |
| 2018/0158820 | A1* | 6/2018 | Chen | H01L 23/485 |
| 2018/0286957 | A1* | 10/2018 | Bae | H01L 21/823475 |
| 2018/0294184 | A1* | 10/2018 | Koh | H01L 27/0886 |
| 2018/0308951 | A1* | 10/2018 | Adusumilli | H01L 23/485 |
| 2018/0350662 | A1* | 12/2018 | You | H01L 29/785 |
| 2019/0123140 | A1* | 4/2019 | Park | H01L 27/11807 |
| 2019/0123162 | A1* | 4/2019 | Xie | H01L 29/783 |
| 2019/0273023 | A1* | 9/2019 | Loh | H01L 21/823425 |
| 2019/0304902 | A1* | 10/2019 | Subramanian | H01L 23/5226 |
| 2019/0305098 | A1* | 10/2019 | Ahn | H01L 29/7851 |
| 2019/0363085 | A1* | 11/2019 | Oh | H01L 21/3086 |
| 2019/0378790 | A1* | 12/2019 | Bohr | H01L 21/76877 |
| 2019/0385946 | A1* | 12/2019 | Xie | H01L 21/823431 |
| 2020/0006228 | A1* | 1/2020 | Yang | H01L 23/5226 |
| 2020/0043787 | A1* | 2/2020 | Su | H01L 21/823821 |
| 2020/0075602 | A1* | 3/2020 | Wang | H01L 27/1104 |
| 2020/0091146 | A1* | 3/2020 | Tsao | H01L 29/0847 |
| 2020/0105603 | A1* | 4/2020 | Chang | H01L 21/76876 |
| 2020/0105671 | A1* | 4/2020 | Lai | H01L 27/0886 |
| 2020/0111713 | A1* | 4/2020 | Zang | H01L 29/785 |
| 2020/0119000 | A1* | 4/2020 | Wang | H01L 29/41791 |
| 2020/0119002 | A1* | 4/2020 | Xie | H01L 29/785 |
| 2020/0119180 | A1* | 4/2020 | Frougier | H01L 21/823481 |
| 2020/0135546 | A1* | 4/2020 | Wang | H01L 21/31116 |
| 2020/0135578 | A1* | 4/2020 | Ching | H01L 21/76832 |
| 2020/0135579 | A1* | 4/2020 | Wu | H01L 21/76805 |
| 2020/0135724 | A1* | 4/2020 | Lin | H01L 27/0886 |

OTHER PUBLICATIONS

Sherazi et al., "Architectural strategies in standard-cell design for the 7 nm and beyond technology node," J. Micro/Nanolith. MEMS MOEMS 15(1), 013507 (2016).

* cited by examiner

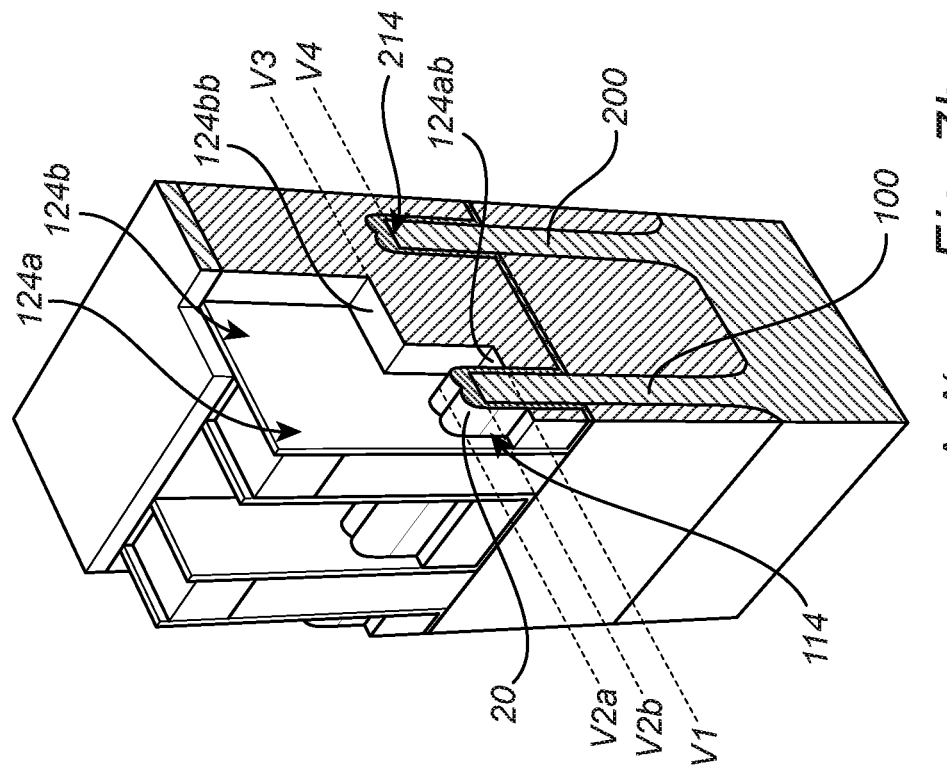
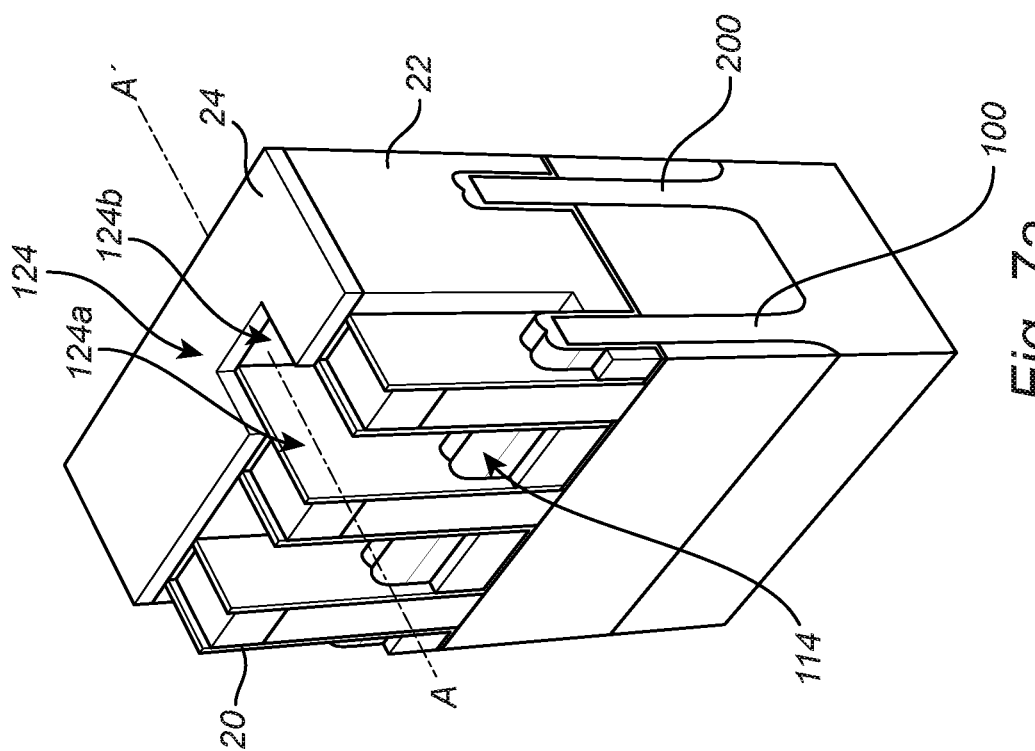
Fig. 7a
Fig. 7b

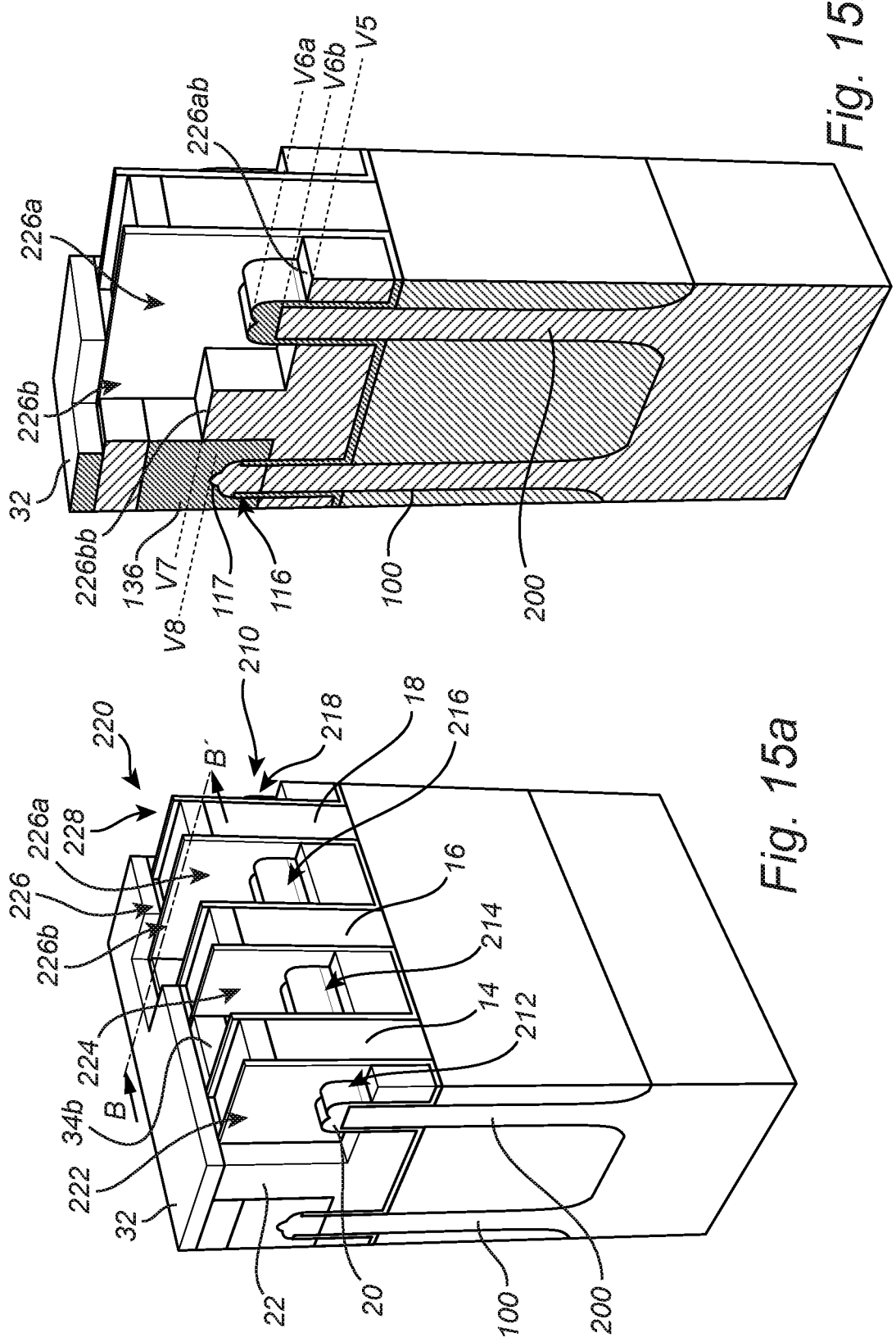

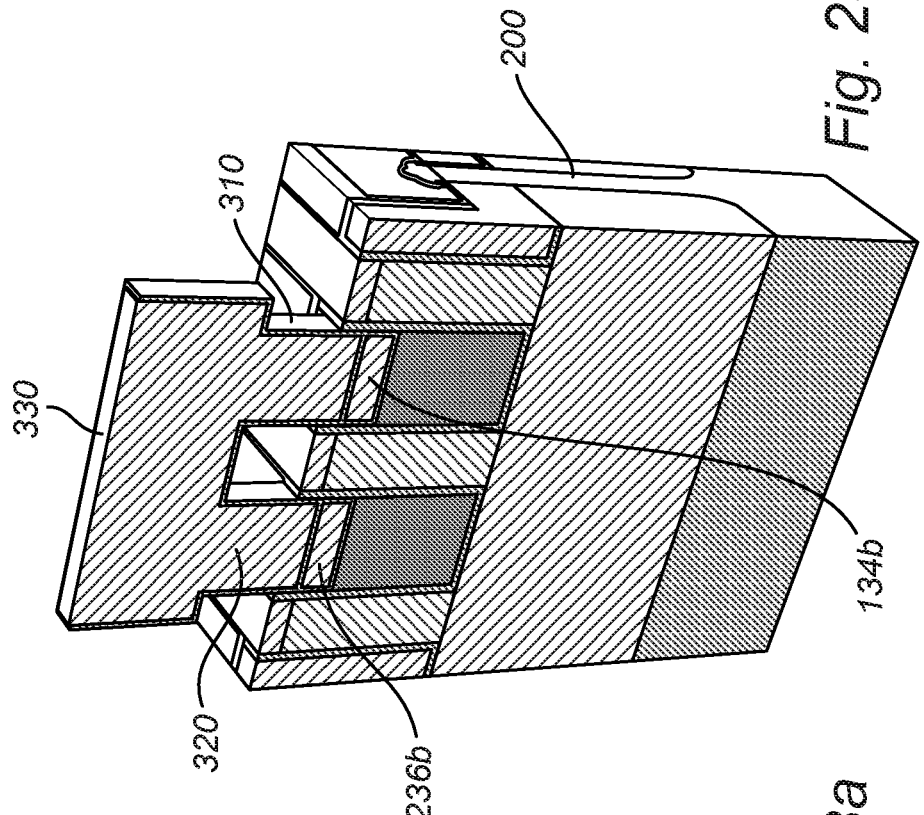
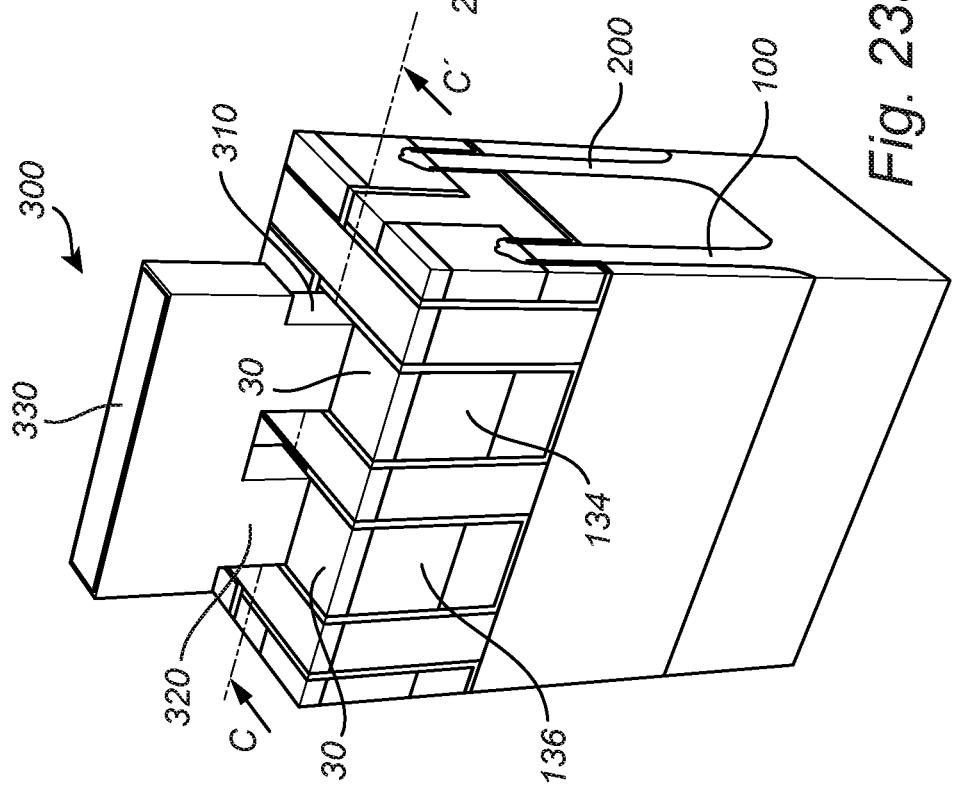
Fig. 23b
Fig. 23a

SEMICONDUCTOR DEVICE AND METHOD

CROSS-REFERENCE TO RELATED APPLICATION

The present application is a non-provisional patent application claiming priority to European Patent Application No. 18152779.7 filed Jan. 22, 2018, the contents of which are hereby incorporated by reference.

TECHNICAL FIELD

The present disclosure relates in one aspect to a semiconductor device. The present disclosure relates in another aspect to a method in the field of semiconductor device processing.

BACKGROUND

In semiconductor device processing, designing integrated circuits having various functionalities typically involves combining a great number of functional cells of standard components and interconnected structures. A functional cell may include a group of semiconductor devices, such as transistors. Intra-cell cell connections/routing between devices of the functional cell may be provided by one or more interconnect levels, each including conductive lines/routing tracks and vias. The functional cell may thereby be designed to provide certain functionality, logic functions, storage functions, or the like. In standard cell methodology, the designer may design circuits by selecting functional cells from a library of standardized functional cells, i.e., standard cells, and interconnect them by further interconnect levels, to design a circuit with desired functions.

As integrated circuits continue to become smaller and smaller and simultaneously comprise an increasing number of semiconductor devices within a given area, there is a desire for reducing the size of the functional cells. However, although advances in miniaturization of semiconductor devices and developments in patterning technology would seem to allow ever denser functional cells, the increased density may introduce challenges in connecting devices of the functional cells to the interconnect levels.

SUMMARY

The present disclosure provides a method for enabling a design flexibility with respect to connecting a source/drain contact and an interconnection level. Further, the present disclosure may reduce the risk of shorts between the source/drain contact and other conductive structures in a vicinity of the source/drain contact. Further and alternative embodiments of the present disclosure may be understood from the following.

According to an aspect of the present disclosure there is provided a method comprising:

forming in an insulating layer a first set of source/drain contact openings, the insulating layer covering:

a first elongated semiconductor structure extending in a first horizontal direction along a substrate and protruding vertically above the substrate, and a second elongated semiconductor structure extending along the substrate in parallel to the first semiconductor structure and protruding vertically above the substrate, wherein the first set of source/drain contact openings are formed above a first set of regions of an upper portion of the first semiconductor structure, wherein a first source/drain contact opening of the first set of source/drain contact openings is formed above a first region of the first set of regions of the first semiconductor structure, the first source/drain contact opening including:

a deep portion formed directly above the first region of the first semiconductor structure, and a shallow portion formed adjacent to the deep portion and extending vertically through the insulating layer such that a level of a bottom surface of the shallow portion is located above a level of a directly opposite first region of an upper portion of the second semiconductor structure, the shallow portion protruding from the deep portion in a second horizontal direction towards the first region of the second semiconductor structure, to a horizontal position disposed at least halfway between the first semiconductor structure and the second semiconductor structure; and forming a first set of source/drain contacts in the first set of source/drain contact openings, wherein a first source/drain contact of the first set of source/drain contacts is formed in the first source/drain contact opening, the first source/drain contact including a vertically extending contact portion arranged in the deep portion and a via landing portion arranged in the shallow portion and protruding horizontally from the vertically extending contact portion; and forming an interconnection level, the interconnection level including a first vertical via abutting the via landing portion.

The present disclosure enables forming of a set of (first) source/drain contacts on a first semiconductor structure, the set including a first source/drain contact providing a via landing portion horizontally offset from the first semiconductor structure such that the first source/drain contact may be contacted by the first via at a horizontal position between the first and second semiconductor structure. As the protruding portion is formed in the shallow portion, the protruding portion will be formed at a level above the first region of the second semiconductor structure. Hence, even at tight pitches, a margin may be provided between the protruding portion and the second semiconductor structure.

The horizontal offset of the first via enables contacting with a horizontal line or routing track extending parallel to the first semiconductor structure and the second semiconductor structure at a position between the semiconductor structures. In other words, the horizontal line need not be aligned with the first semiconductor structure. As will be further explained in the following, this design flexibility enables designing of functional cells with a reduced number of routing tracks for intra-cell routing, and hence of a reduced cell height.

Each of the first and second elongated semiconductor structures may be formed as a respective semiconductor fin, i.e., a fin-shaped semiconductor structure extending in the first horizontal direction along the substrate and protruding above the substrate.

As used herein, the term "level" may refer to a level or height above the substrate, as viewed in a direction normal to the substrate (i.e., normal to a main surface of the substrate). It should further be understood that when two different levels are related to each other, the two levels are considered with respect to a common point of reference on the substrate.

As used herein, the term "vertical" denotes an orientation which is normal to (a main surface of) the substrate. Correspondingly, the term "horizontal" denotes an orientation which is parallel to (a main surface of) the substrate, or transverse to the vertical orientation. Accordingly, relative terms such as "above", "upper", "top", "below", "lower", and "bottom" refer to relative positions along a vertical axis.

As used herein, the term "source/drain contact openings" refers to openings in the insulating layer which extend vertically through the insulating layer to a depth such that the regions on the below structure are exposed, i.e., may be accessed, through the openings, at least following removal of first spacer layer portions which, according to some embodiments, may cover the regions of the below structure.

The deep portion may be formed to extend vertically through the insulating layer such that a level of a bottom surface of the deep portion is located at or below a level of the first region of the first semiconductor structure. This enables a relatively large fin-source/drain contact area to be achieved. Other options for the depth of the deep portion do, however, exist as set out below.

The method may further comprise:

forming, in the insulating layer, a second set of source/drain contact openings above a second set of regions of the upper portion of the second semiconductor structure, wherein the second set of source/drain contact openings includes:

a first source/drain contact opening formed above the first region of the second semiconductor structure, and a second source/drain contact opening formed above a second region of the second set of regions, the second source/drain contact opening including:

a deep portion formed directly above the second region of the second semiconductor structure, and a shallow portion formed adjacent to the deep portion and extending vertically through the insulating layer such that a level of a bottom surface of the shallow portion is located above a level of a directly opposite second region of the first set of regions of the first semiconductor structure, the shallow portion protruding from the deep portion, in a third horizontal direction towards the second region of the first semiconductor structure, to a horizontal position disposed at least halfway between the second semiconductor structure and the first semiconductor structure; and forming a second set of source/drain contacts in the second set of source/drain contact openings, wherein a first source/drain contact of the second set of source/drain contacts is formed in the first source/drain contact opening of the second set of source/drain contact openings and a second source/drain contact of the second set of source/drain contacts is formed in the second source/drain contact opening of the second set of source/drain contact openings and includes a vertically extending contact portion arranged in the deep portion and a via landing portion arranged in the shallow portion and protruding horizontally from the vertically extending contact portion; and wherein the interconnection level is formed subsequent to forming the first and the second set of source/drain contacts and is formed to further include a second vertical via abutting the via landing portion of the second source/drain contact of the second set of source/drain contacts.

Similar to the above, a source/drain contact (i.e., the second contact of the second set of contacts) may be formed on the second semiconductor structure to provide a via landing portion horizontally offset from the second semiconductor structure. As the protruding portion is formed in the shallow portion, the protruding portion of the second contact will be formed at a level above the second region of the first semiconductor structure. Hence, even at tight pitches, a margin may be provided between the protruding portion and the second semiconductor structure. Moreover, the second source/drain contact may be connected to a horizontal line not being aligned with the second semiconductor structure.

The deep portion of the second source/drain contact opening may be formed to extend vertically through the insulating layer such that a level of a bottom surface of the deep portion is located at or below a level of the second region of the second semiconductor structure. This enables a relatively large fin-source/drain contact area to be achieved. Other options for the depth of the deep portion do, however, exist as set out below.

A set of gate structures including at least one gate structure may extend across the first semiconductor structure and the second semiconductor structure, wherein the set of gate structures are embedded by the insulating layer, and wherein each of the regions of the first semiconductor structure may be a respective region formed adjacent to at least one gate structure of the set of gate structures. Further, if the aforementioned second set of contact openings is formed, each of the regions of the second semiconductor structure may be a respective region formed adjacent to at least one gate structure of the set of gate structures.

The set of gate structures and the first set of regions may be covered by a first (e.g., insulating) spacer layer, wherein the first set of source/drain contact openings exposes portions of the first spacer layer covering the first set of regions. The first spacer layer may act as a protective layer for the first/second set of regions until it is time to form the first set of source/drain contacts in the first set of source/drain contact openings.

The method may comprise removing the portions of the first spacer layer prior to forming the first set of source/drain contacts. The deep portion of the first source/drain contact opening may be formed to extend vertically through the insulating layer such that a level of a bottom surface of the deep portion is located at or below a level of a top surface of the first spacer layer portion on the first region of the first semiconductor structure.

Further, if the aforementioned second set of source/drain contact openings is formed, the second set of source/drain contact openings exposes portions of the first spacer layer covering the second set of regions. The method may comprise removing the portions of the first spacer layer prior to forming the second set of source/drain contacts. The deep portion of the aforementioned second source/drain contact opening of the second set of source/drain contact openings may be formed to extend vertically through the insulating layer such that a level of a bottom surface of the deep portion is located at or below a level of a top surface of the first spacer layer portion on the second region of the second semiconductor structure.

Forming the first source/drain contact opening of the first set of source/drain contact openings may comprise:

forming the deep portion by etching the insulating layer above the first region of the first semiconductor structure;

filling at least partially the deep portion with a fill material;

forming the shallow portion by etching the insulating layer selectively to the fill material adjacent to the deep portion; and removing the fill material in the deep portion by etching the fill material selectively to the insulating layer.

Hence, the first source/drain contact opening above the first semiconductor structure may be formed with a step-shaped bottom surface using two etching steps, wherein the fill material in the deep portion counteracts a further deepening of the deep portion during the etching of the shallow portion.

More specifically, forming the first source/drain contact opening of the first set of source/drain contact openings may comprise:

forming a first contact etch mask on the insulating layer, wherein an opening is formed in the first contact etch mask above the first region of the first semiconductor structure;

forming the deep portion by etching the insulating layer through the opening;

depositing a fill material layer covering the first contact etch mask and filling the deep portion;

forming a second contact etch mask on the fill material layer, wherein an opening is formed in the second contact etch mask above a region of the insulating layer adjacent to the deep portion;

etching the fill material layer through the opening in the second contact etch mask such that a portion of the first contact etch mask formed above the region of the insulating layer adjacent to the deep portion is exposed and such that a portion of the fill material layer remains in the deep portion;

removing the portion of the first contact etch mask to expose the region of the insulating layer adjacent to the deep portion, thereby forming an enlarged opening in the first contact etch mask;

forming the shallow portion by etching the insulating layer through the enlarged opening selectively to the fill material layer portion; and removing the fill material in the deep portion by etching the fill material selectively to the insulating layer.

This enables forming of the first source/drain opening above the first semiconductor structure with an improved degree of individual control of the depth of the deep portion and the shallow portion, respectively.

Forming the second source/drain contact opening of the second set of source/drain contact openings may comprise:

forming the deep portion by etching the insulating layer above the second region of the second semiconductor structure;

filling at least partially the deep portion with a fill material;

forming the shallow portion by etching the insulating layer selectively to the fill material adjacent to the deep portion; and removing the fill material in the deep portion by etching the fill material selectively to the insulating layer.

Hence, the second source/drain contact opening above the second semiconductor structure may be formed with a step-shaped bottom surface using two etching steps, wherein the fill material in the deep portion counteracts a further deepening of the deep portion during the etching of the shallow portion.

More specifically, forming the second source/drain contact opening of the second set of source/drain contact openings may comprise:

forming a third contact etch mask on the insulating layer, wherein an opening is formed in the third contact etch mask above the second region of the second semiconductor structure;

forming the deep portion by etching the insulating layer through the opening;

depositing a fill material layer covering the third contact etch mask and filling the deep portion;

forming a fourth contact etch mask on the fill material layer, wherein an opening is formed in the fourth contact etch mask above a region of the insulating layer adjacent to the deep portion;

etching the fill material layer through the opening in the fourth contact etch mask such that a portion of the third contact etch mask formed above the region of the insulating layer adjacent to the deep portion is exposed and such that a portion of the fill material layer remains in the deep portion;

removing the portion of the third contact etch mask to expose the region of the insulating layer adjacent to the deep portion, thereby forming an enlarged opening in the third contact etch mask;

forming the shallow portion by etching the insulating layer through the enlarged opening selectively to the fill material layer portion; and removing the fill material in the deep portion by etching the fill material selectively to the insulating layer.

This enables forming of the second source/drain opening above the second semiconductor structure with an improved degree of individual control of the depth of the deep portion and the shallow portion, respectively.

The method may further comprise forming, in the insulating layer, a second set of source/drain contact openings above a second set of regions of the upper portion of the second semiconductor structure;

subsequent to forming the second set of source/drain contact openings, forming a contact spacer layer on sidewalls of the second set of source/drain contact openings; and subsequent to forming the contact spacer layer, forming a second set of source/drain contacts in the second set of source/drain contact openings.

The spacer helps provide at least minimum electrical insulation (given by the thickness of the contact spacer layer) between the second set of source drain/contacts and the first set of source/drain contacts. In particular, insulation may be provided between the via landing portion of the first source/drain contact of the first set of source/drain contacts and the source/drain contact formed in the first source/drain contact opening of the second set of source/drain contact openings.

The via landing portion of the first source/drain contact may be formed to protrude in the second horizontal direction to such an extent that, subsequent to the forming of the second set of source/drain contact openings, an end portion of the via landing portion of the first source/drain contact forms a sidewall in the first source/drain contact opening of the second set of source/drain contact openings, and wherein the contact spacer layer is formed on the end portion. Hence, even if the end portion of the via landing portion is exposed in the first source/drain contact opening of the second set of source/drain contact openings, an electrical insulation between the contacts may be enabled.

A set of gate structures including at least one gate structure may extend across the first semiconductor structure and the second semiconductor structure, wherein the set of gate structures are embedded by the insulating layer and wherein each of the regions of the first semiconductor structure and each of the regions of the second semiconductor structure is a region formed adjacent to at least one gate structure of the set of gate structures. In other words, the first set of regions and the second set of regions may be regions of the respective first/second semiconductor structure which are exposed by the gate structures (not ruling out that the regions, although not being covered by the gate structures, still may be covered by first spacer layer portions which, according to some embodiments, may cover the regions of the below structure). This allows, in turn, the first set of regions and the second set of regions to be formed self-aligned with respect to the gate structures.

The first region of the first set of regions and the first region of the second set of regions may be formed on a first side of the at least one gate structures. The second region of the first semiconductor structure and the second region of the second semiconductor structure may be formed on a second side of the at least one gate structures, opposite the first side.

The set of gate structures and the second set of regions of the second semiconductor structure may be covered by a first spacer layer, wherein the second set of source/drain contact openings exposes portions of the first spacer layer covering the second set of regions and portions of the first spacer layer covering sidewalls of the set of gate structures, wherein the method may further comprise:

removing the portions of the first spacer layer from the second set of regions and from the sidewalls of the set of gate structures, wherein the sidewalls of the set of gate structures form exposed sidewalls of the second set of source/drain contact openings; and forming a contact spacer layer on sidewalls of the second set of source/drain contact openings.

The first spacer layer may act as a protective layer for the second set of regions until it is time to form the second set of source/drain contacts in the second set of source/drain contact openings. Moreover, the spacer helps provide at least minimum electrical insulation (given by the thickness of the contact spacer layer) between the second set of source drain/contacts and the first set of source/drain contacts. In particular, insulation may be provided between the via landing portion of the first source/drain contact on the first set of source/drain contacts and the source/drain contact formed in the first source/drain contact opening of the second set of source/drain contact openings. As the first spacer layer is removed from the sidewalls of the gate structures prior to forming of the contact spacer layer, a potential issue of volume reduction of the contact openings due to the contact spacer layer may be mitigated.

The set of gate structures may form a set of sacrificial gate structures, and the method may further comprise replacing the set of sacrificial gate structures with a set of replacement gate structures subsequent to forming the second set of source/drain contacts and prior to forming the interconnection level.

The method may further comprise: subsequent to forming the first set of source/drain contact openings and prior to forming the first set of source/drain contacts, forming a first set of source/drain regions in the first set of regions of the first semiconductor structure. If gate structures extend across the structures, as described above, the source/drain regions may be formed in a self-aligned manner with respect to the gate structures.

More specifically, the method may comprise: subsequent to forming the first set of source/drain contact openings and prior to forming the first set of source/drain contacts, epitaxially growing a respective doped semiconductor top portion in each region of the first set of regions. Doped source/drain regions may hence be selectively formed in the first set of regions of the first semiconductor structure.

The method may further comprise: subsequent to forming the second set of source/drain contact openings and prior to forming the second set of source/drain contacts, forming a second set of source/drain regions in the second set of regions of the second semiconductor structure. If gate structures extend across the structures, as described above, the source/drain regions may be formed in a self-aligned manner with respect to the gate structures.

More specifically, the method may comprise: subsequent to forming the second set of source/drain contact openings and prior to forming the second set of source/drain contacts, epitaxially growing a respective doped semiconductor top portion in each region of the second set of regions, wherein the level of the bottom surface of the shallow portion of the first source/drain contact opening is located above a level of the doped semiconductor top portion on the first region of the second semiconductor structure. Doped source/drain regions may hence be selectively formed in the second set of regions of the second semiconductor structure.

The forming of the first set of source/drain contacts may comprise depositing a contact material in the first set of source/drain openings, and the method may further comprise forming a capping layer on the first set of source/drain contacts. The capping layer may hence act as a protective layer for the first set of source/drain contacts during subsequent processing steps.

The forming of the second set of source/drain contacts may comprise depositing a contact material in the second set of source/drain openings, and the method may further comprise forming a capping layer on the second set of source/drain contacts. The capping layer may hence act as a protective layer for the first set of source/drain contacts during subsequent processing steps.

According to one embodiment, the first semiconductor structure and the second semiconductor structure form part of a functional cell, wherein the interconnection level is formed to include a middle routing track extending in the first horizontal direction and arranged at a horizontal position halfway between the first and second semiconductor structures, the middle routing track abutting the first via. The first source/drain contact of the first set of source/drain contacts may hence be connected to a routing track disposed as a mid track with respect to the functional cell.

In cases where the second set of source/drain contacts is also formed, the middle routing track may also abut the second via. Thereby, a cross-coupling of the first source/drain contact on the first semiconductor structure to the second source/drain contact on the second semiconductor structure may be provided through a single interconnection level (i.e., an interconnection level including the middle routing track and first and second vias). This helps provide an area-efficient intra-cell routing.

According to some embodiments, the present disclosure provides a semiconductor device comprising:
  a substrate;
  a first elongated semiconductor structure extending in a first horizontal direction along the substrate and protruding vertically above the substrate, wherein a first set of source/drain regions are formed on the first semiconductor structure;
  a second elongated semiconductor structure extending along the substrate in parallel to the first semiconductor structure and protruding vertically above the substrate, wherein a second set of source/drain regions are formed on the second semiconductor structure;
  a first set of source/drain contacts formed on the first set of source/drain regions, wherein a first source/drain contact of the first set of source/drain contacts includes:
    a vertically extending contact portion formed directly above (and abutting) a first source/drain region of the first set of source/drain regions, and a via landing portion protruding horizontally from the vertically extending contact portion in a second horizontal direction towards the second semiconductor structure (more specifically towards a first source/drain region of the second set of source/drain regions directly opposite the first source/drain region of the first set of source/drain regions), to a horizontal position disposed at least halfway between the first semiconductor structure and the second semiconductor structure; and an interconnection level including a first vertical via abutting the via landing portion.

According to some embodiments, the device further comprises:

a second set of source/drain contacts formed on the second set of source/drain regions, wherein a first source/drain contact of the second set of source/drain contacts includes:
  a vertically extending contact portion formed directly above (and abutting) a second source/drain region of the second set of source/drain regions, and
  a via landing portion protruding horizontally from the vertically extending contact portion in a third horizontal direction towards the first semiconductor structure (more specifically towards a second source/drain region of the first set of source/drain regions directly opposite the second source/drain region of the second set of source/drain regions), to a horizontal position disposed at least halfway between the second semiconductor structure and the first semiconductor structure;
wherein the interconnection level further includes a second vertical via abutting the via landing portion.

According to one embodiment, the first semiconductor structure and the second semiconductor structure form part of a functional cell, wherein the interconnection level is formed to include a middle routing track extending in the first horizontal direction and arranged at a horizontal position halfway between the first and second semiconductor structures, and wherein the middle routing track abuts the first via.

In cases where the second set of source/drain contacts is also formed, the middle routing track may also abut the second via.

BRIEF DESCRIPTION OF THE DRAWINGS

FIG. 7a illustrates another device processing step in the method of forming a semiconductor device, according to an example embodiment.

FIG. 7b illustrates the device processing step of FIG. 7a cross-sectioned along line A-A', according to an example embodiment.

FIG. 15a illustrates another device processing step in the method of forming a semiconductor device, according to an example embodiment.

FIG. 15b illustrates the device processing step of FIG. 15a cross-sectioned along line B-B', according to an example embodiment.

FIG. 23a illustrates a device processing step for forming an interconnection level, according to an example embodiment.

FIG. 23b illustrates the device processing step of FIG. 23a cross-sectioned along line C-C', according to an example embodiment.

DETAILED DESCRIPTION

A method for forming a semiconductor device will now be described with reference to the figures. The method may also be referred to as a method for source/drain contact formation.

Figure 1:
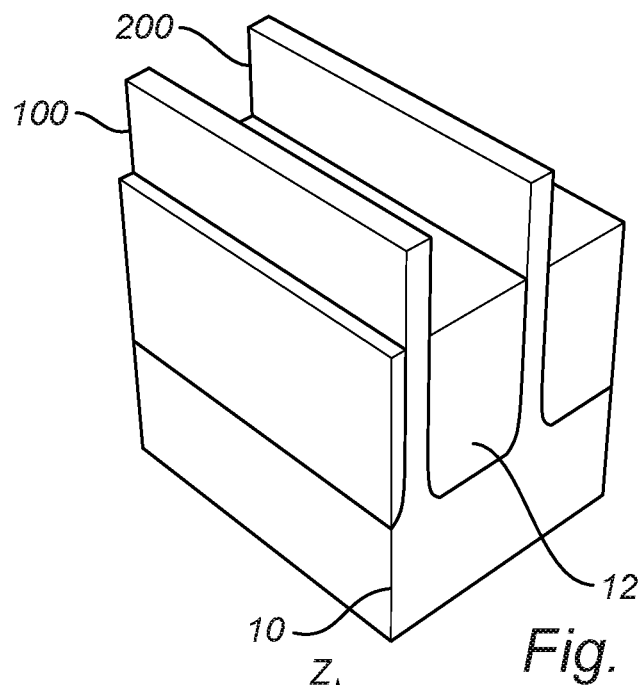
FIG. 1 illustrates a device processing step in a method of forming a semiconductor device, according to an example embodiment.

FIG. 1 shows, in perspective, a section of a substrate 10. The substrate 10 may extend laterally or horizontally beyond the illustrated section. The illustrated planes of section extending through the substrate 10 is common to all subsequent figures, unless stated otherwise. It is noted that the relative dimensions of the shown structures, for instance the relative thickness of layers, is merely schematic and may, for the purpose of illustrational clarity, differ from a physical structure. The indicated directions X, Y, and Z refer to a first horizontal direction, a second horizontal direction, and a vertical direction, respectively.

It should further be noted that, owing to the schematic nature of the drawings, the relative dimensions of the various structures and layers are not drawn to scale. Rather, the dimensions have been adapted for illustrational clarity and to facilitate understanding of the following description.

The illustrated section of the substrate 10 may correspond to a section in which a functional cell is to be formed, such as a logic cell or a standard cell of a selected type. It will be appreciated that neighboring sections of the substrate 10 outside of the shown region may present a similar structure and be processed in a corresponding manner as the illustrated section, in order to provide a plurality of similarly configured functional cells in parallel.

The substrate 10 may be a conventional semiconductor substrate such as a silicon (Si) substrate, a germanium (Ge) substrate, a silicon germanium (SiGe) substrate, a silicon on insulator (SOI) substrate, a germanium on insulator (GeOI) substrate, or a SiGe on insulator (SiGeOI) substrate, to name a few examples.

A first elongated semiconductor structure 100 and a second elongated semiconductor structure 200 extend in parallel to each other in a first horizontal direction X along the substrate 10 and protrude vertically above the substrate 10. The first semiconductor structure 100 and the second semiconductor structure 200 each have the shape of a respective semiconductor fin. The first semiconductor structure 100 and the second semiconductor structure 200 may therefore in the following be referred to as the first fin 100 and the second fin 200, respectively.

Each fin 100, 200 may, as shown, have a top surface and two opposing sidewalls that protrude from the substrate 10. The fins 100, 200 may be formed by etching trenches in the substrate 10 or in a further semiconductor layer deposited on the substrate 10. The trenches may be formed using conventional patterning techniques, such as single-patterning techniques, or multiple-patterning techniques, e.g., self-aligned double patterning (SADP) or quadruple patterning (SAQP). By way of example, a fin spacing may be on the order of a few tens of nm, such as about 10-50 nm.

The first and second fins 100, 200 protrude above an insulating layer 12. The insulating layer 12 may, e.g., be arranged in trenches on opposite sides of the respective fins 100, 200, and, e.g., form a trench isolation or shallow trench isolation, STI. The first and the second fins 100, 200, may, as shown, have a same height above the substrate 10 and/or the insulating layer 12.

Figure 2:
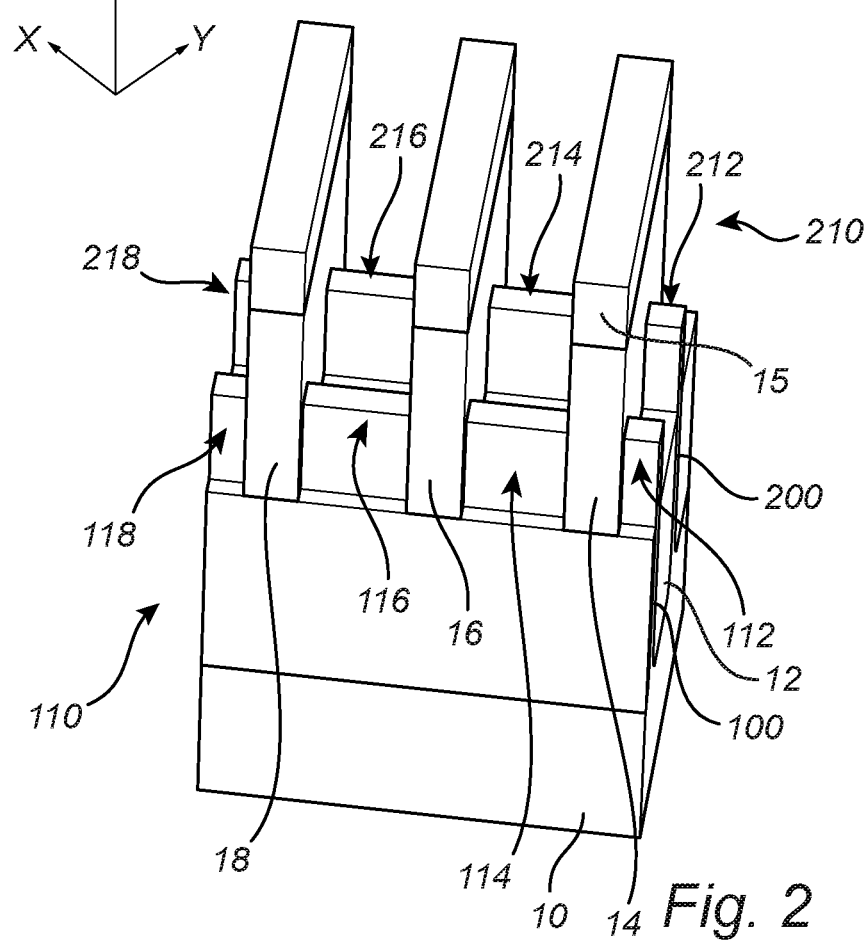
FIG. 2 illustrates another device processing step in the method of forming a semiconductor device, according to an example embodiment.

In FIG. 2, a set of gate structures 14, 16, 18 has been formed to extend across the first fin 100 and the second fin 200. The gate structures 14, 16, 18 extend in a second horizontal direction Y. Regions of an upper portion of the first fin 100 (e.g., regions of the top surface of the first fin 100) disposed adjacent to and/or in between the gate structures 14, 16, 18 define a first set of regions 110 of the first fin 100. Regions of an upper portion of the second fin 200 (e.g., regions of the top surface of the second fin 200) disposed adjacent to and/or in between the gate structures 14, 16, 18 define a second set of regions 210 of the second fin 200. The first set of regions 110 include first regions 112, 114, 116, 118. The second set of regions 210 include second regions 212, 214, 216, 218. Each first region 112, 114, 116, 118 may form a source/drain region on the first fin 100. Each second region may 212, 214, 216, 218 may form a source/drain region on the second fin 200. Although FIG. 2 shows three gate structures, this is only an example, and fewer gate structures (such as one or two) or more gate structures (such as four or five, etc.) may be formed to extend across the first and second fins 100, 200.

The gate structures 14, 16, 18 may be conductive gate structures (e.g., gate electrodes). Alternatively, the gate structures 14, 16, 18 may be sacrificial gate structures intended to be replaced by final gate electrodes at a later stage. In any case, the gate structures 14, 16, 18 may be formed by depositing a layer of gate material to cover the first and second fins 100, 200 and patterning the gate material layer to form the gate structures 14, 16, 18 as shown. In cases where the gate structures 14, 16, 18 are final gate electrodes, a gate dielectric may be present between the gate structures 14, 16, 18 and the fins 100, 200. Examples of conductive gate materials that may be used include metals, such as TiN, TaN, TiTaN, Al, TiAl, TiC, TiAlC, or suitable combinations or stacks thereof. The metals may be deposited, for instance, by atomic layer deposition (ALD) or chemical vapor deposition (CVD). An example of a sacrificial gate material is polysilicon.

As shown in FIG. 2, a respective gate cap 15 (e.g., a hard mask material such as a nitride-based material, for instance $Si_3N_4$) may remain on the gate structures 14, 16, 18 following the gate structure formation (e.g., gate mask 15 on the gate structure 14).

As may be further understood from the following, a number of transistor devices may be formed along the first fin 100, the number depending on the number of gate structures 14, 16, 18. Correspondingly, a number of transistor devices may be formed along the second fin 100. The regions 110 of the first fin 100 may form source/drain regions of the one or more transistor(s) along the first fin 100. The regions 210 of the second fin 200 may form source/drain regions of the one or more transistor(s) along the second fin 200. For instance, the region 114 and the region 116 may form a respective source/drain region of a first transistor along the first fin 100. The gate structure 16 may (possibly following a replacement metal gate process) form a gate of the first transistor. The region 214 and the region 216 may form a respective source/drain region of a second transistor along the second fin 200. The gate structure 16 may (possibly following a replacement metal gate process) form a gate of the second transistor.

Figure 3:
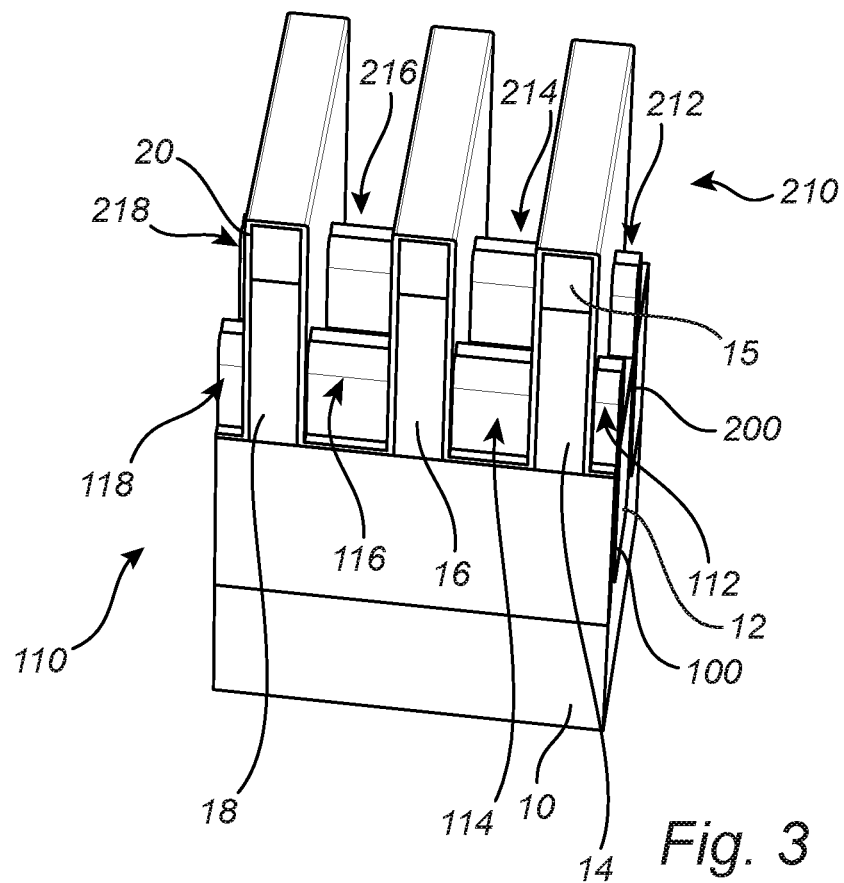
FIG. 3 illustrates another device processing step in the method of forming a semiconductor device, according to an example embodiment.

With reference to FIG. 3, the set of gate structures 14, 16, 18, the first set of regions 110, and the second set of regions 210 have been covered by a first spacer layer 20. The first spacer layer 20 may, as it forms a sidewall spacer on the gate structures 14, 16, 18, also be referred to as a gate spacer layer 20. The first spacer layer 20 may, as shown, also cover the insulating layer 12. The first spacer layer 20 may be an oxide layer, for instance a silicon oxide carbide layer-based layer, such as SiOC, SiBCN, SiOCN, or SiOBCN. In cases where the gate structures 14, 16, 18 are final gate electrodes, the first spacer layer 20 may also be formed by high-k dielectrics, such as $HfO_2$, $ZrO_2$, $Al_2O_3$, to name a few. The first spacer layer 20 may be deposited by ALD.

Figure 4:
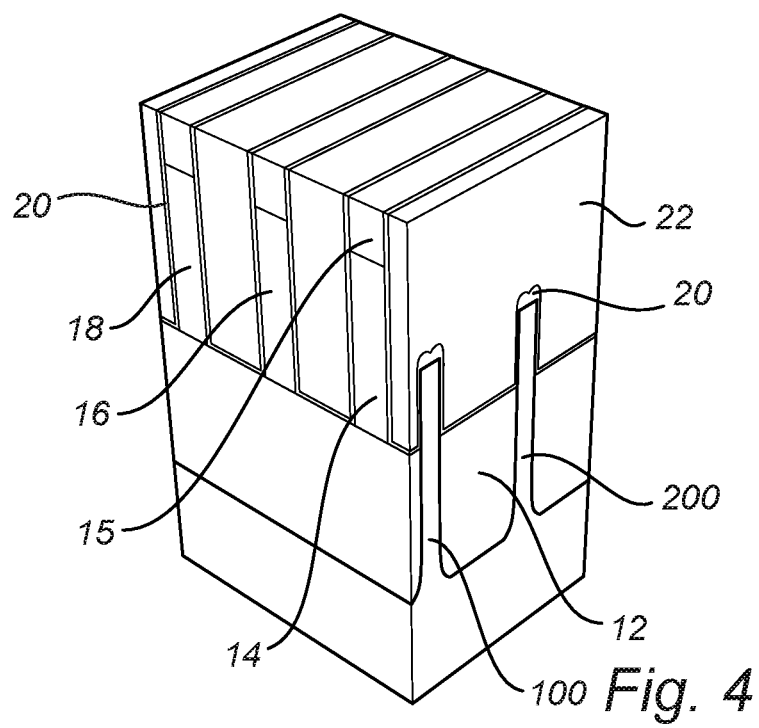
FIG. 4 illustrates another device processing step in the method of forming a semiconductor device, according to an example embodiment.

In FIG. 4, an insulating layer 22 has been formed to embed the first and second fins 100, 200 and the gate structures 14, 16, 18. The insulating layer 22 may be formed by a dielectric material different from the first spacer layer 20. The insulating layer 22 may, for instance, be formed of a low-k dielectric material, such as silicon oxide ($SiO_2$). The insulating layer 22 may be deposited by CVD. The insulating layer 22 may be deposited with a thickness to completely cover the gate structures 14, 16, 18. A planarization step may thereafter be performed, for instance by chemical mechanical polishing (CMP), to obtain a planarized insulating layer 22, exposing the gate caps 15.

Figure 5:
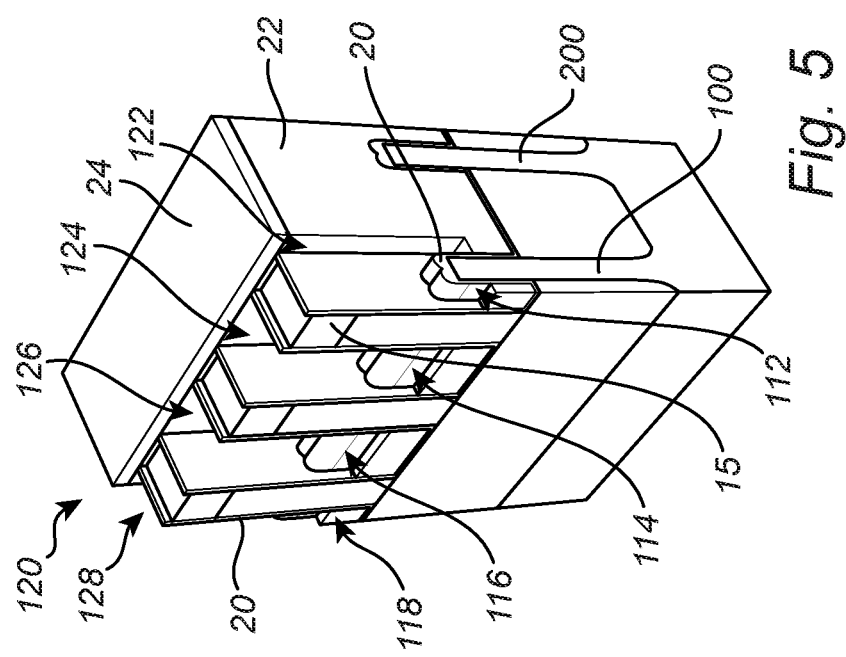
FIG. 5 illustrates another device processing step in the method of forming a semiconductor device, according to an example embodiment.

In FIG. 5 a first set of source/drain contact openings 120 has been formed in the insulating layer 22. Each opening 122, 124, 126, 128 of the first set of source/drain contact openings 120 is formed above a respective region of the first set of regions 110. The opening 122 is formed above the region 112. The opening 124 is formed above the region 114. The opening 126 is formed above the region 116. The opening 128 is formed above the region 118.

A first contact etch mask 24 is formed on the insulating layer 22. The etch mask 24 may be formed by a hard mask material, for instance a nitride-based material. An opening is formed in the first contact etch mask 24, e.g., by patterning the etch mask 24. The opening is formed to extend along the first fin 100, above each region 112, 114, 116, 118 of the first set of regions 110. The first set of source/drain contact openings 120 may thereafter be formed by etching the insulating layer 22 through the opening in the first contact etch mask 24. The etching may be a dry etch, such as a reaction ion etch (RIE) or an ion beam etch (IBE).

Figure 6:
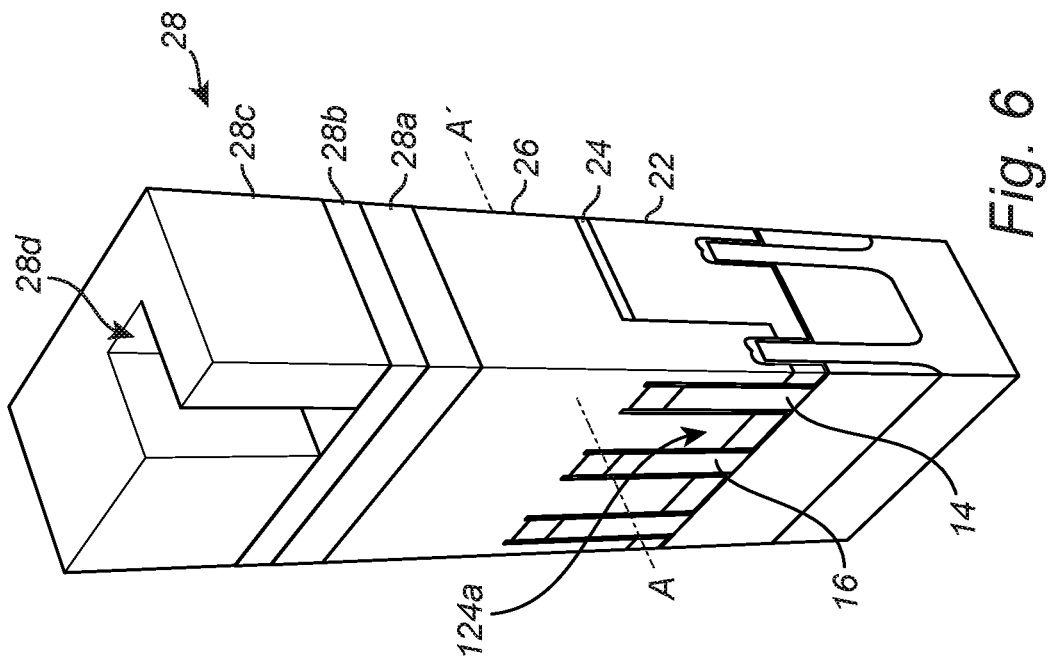
FIG. 6 illustrates another device processing step in the method of forming a semiconductor device, according to an example embodiment.

The first set of source/drain contact openings 120 includes an opening 124, which in the following may be referred to as the first opening 124. The first opening 124 is formed above the region 114, which in the following may be referred to as the first region 114 (of the first fin 100). At the stage of the process flow shown in FIG. 5, the first opening 124 has not yet been provided with its final form. The portion of the first opening 124 which has been formed may be referred to as a deep portion 124a of the first opening 124. In FIG. 6, a fill material layer 26 has been deposited to cover the first contact etch mask 24 and fill the deep portion 124a. The fill material layer 26 may, for instance, be a carbon-based material, such as amorphous carbon (a-C), wherein the fill material layer 26 may be formed by spin-on deposition. The fill material layer 26 may, however, also be some other material that may fill the deep portion 124a, can be removed selectively to the insulating layer 22, and can be provided with a planar top surface.

A second contact etch mask 28 has been formed on the fill material layer 26. The second contact etch mask 28 may be any type of single or composite etch mask being able to act as an etch mask during etching of the fill material layer 26, the first contact etch mask 24, and the insulating layer 22.

The second etch mask 28 may, as one example, be a lithographic layer stack including a number of layers such as a silicon oxide nitride (SiON) layer 28a, a bottom antireflection coating (BARC) layer 28b, and a resist layer 28c.

An opening 28d has been formed in the resist layer 28c. The opening 28d is formed above a region of the insulating layer 22 adjacent to the deep portion 124a. The opening 28d may, as shown, extend also above the (filled) deep portion 124a.

In FIG. 7a, the opening 28d has been transferred into the lower layers of the second etch mask 28, e.g., layers 28b and 28a, to expose the fill material layer 26. The opening 28d has subsequently, in an etching process including a sequence of etching steps, been transferred into the fill material layer 26 and through a portion of the first contact etch mask 24 adjacent to the deep portion 124a to form an enlarged opening in the first contact etch mask 24, as shown in FIG. 7a. The insulating layer 22 has subsequently been etched through the enlarged opening in the first contact etch mask 24, selectively to the fill material layer 26 to form a shallow portion 124b. The deep portion 124a and the shallow portion 124b together define the completed first opening 124. The fill material layer 26 has subsequently been removed from the deep portion 124a, selectively to the etch mask 24 material and the insulating layer 22.

FIG. 7b shows in perspective a cross-sectional view taken along line A-A' indicated in FIG. 7a. As may be seen, the deep portion 124a is formed directly above the first region 114 of the first fin 100 and extends vertically through the insulating layer 22. A level V1 of a bottom surface 124ab of the deep portion 124a (formed by a remaining thickness portion of the insulating layer 22 under the deep portion 124a) is located below a level V2b of the first region 114. The level V2b may correspond to the level of the top surface of the fin 100. The region 114 of the fin 100 thus protrudes above the bottom surface 124ab. However, it is also possible to form the deep portion 124a such that the levels V1 and V2b coincide. It is also possible to form the deep portion 124a such that the level V1 is located at or below a level V2a of the top surface of the first spacer layer portion 20 on the first region 114. This may still allow the first region 114 to be accessed by removing the top first spacer layer portion 20 at a later stage of the process.

The shallow portion 124b is formed adjacent to the deep portion 124a and extends vertically through the insulating layer 22 such that a level V3 of a bottom surface 124bb of the shallow portion 124b (formed by a remaining thickness portion of the insulating layer 22 under the shallow portion 124b) is located above a level V4 of the region 214 of the second fin 200, which is directly opposite to the first region 114. The region 214 may, in the following, be referred to as the first region 214 (of the second fin 200). The level V4 corresponds to the level of the top surface of the fin 200.

In cases where semiconductor top portions are to be grown in the second set of regions 210 at a later stage, as will be described below, the deep portion 124a may be formed such that the level V1 of the bottom surface 124a is located above a level V9 (illustrated in FIG. 19c) of the top semiconductor top portions.

Figure 7C:
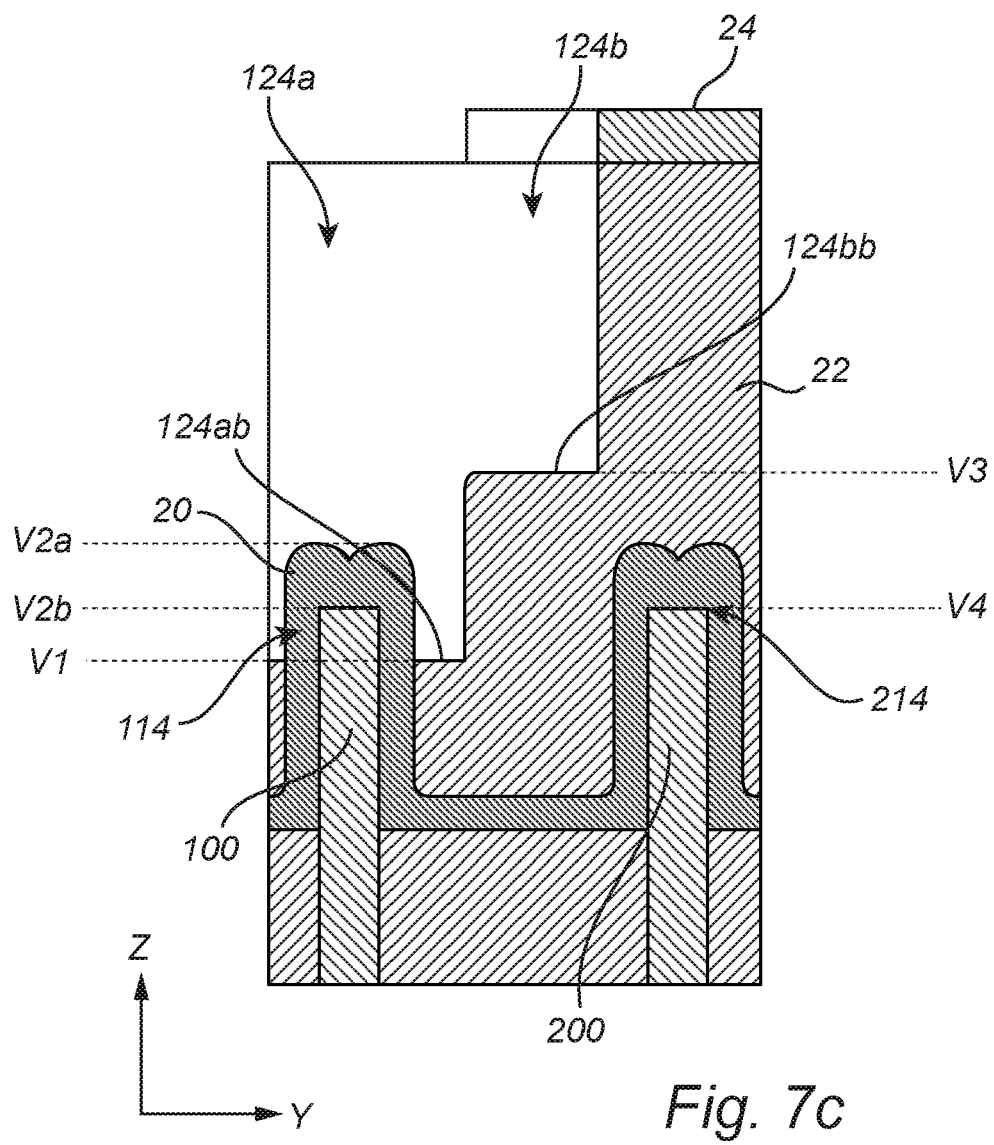
FIG. 7c illustrates a portion of a cross-sectional view of the device processing step of FIG. 7a along line A-A', according to an example embodiment.

FIG. 7c shows in a plan view a part of the cross-section in FIG. 7a. As may be seen, the shallow portion 124b protrudes from the deep portion 124a in the second horizontal direction Y, towards the first region 214 of the second fin 200. The shallow portion 124b protrudes to, and optionally, as shown, slightly past a horizontal position disposed halfway between the first fin 100 and the second fin 200.

The above discussion concerning the depth of the deep portion 124a applies correspondingly to the further source/drain contact openings of the first set 120. Accordingly, the openings 122, 126, 128 may each present corresponding bottom surfaces formed at a level at or below a level of the respective regions 112, 116, 118 of the fin 100, or at or below a level of the top surface of the first spacer layer portion 20 on the respective regions 112, 116, 118. More specifically, the openings 122, 126, 128 and the deep portion 124a may all be formed to present bottom surfaces located at a same level, e.g., level V1.

FIGS. 8-11 show in greater detail a process sequence that may be performed to form the first contact opening, including the deep portion 124a and the shallow portion 124b.

Figures 8, 9:
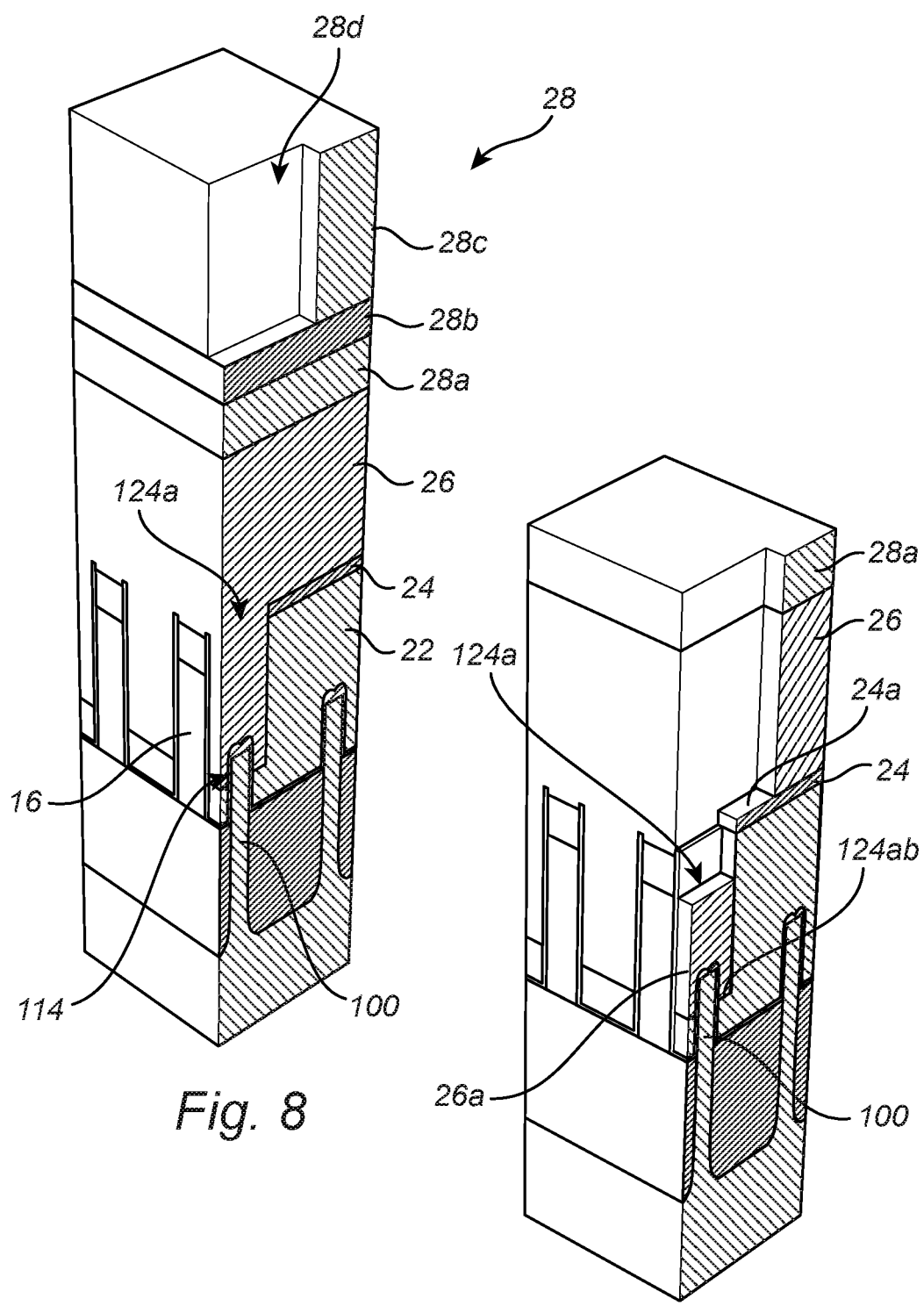
FIG. 8 illustrates another device processing step in the method of forming a semiconductor device, according to an example embodiment.
FIG. 9 illustrates another device processing step in the method of forming a semiconductor device, according to an example embodiment.

FIG. 8 shows in perspective a cross-sectional view taken along the line A-A' through the structure at the stage reached in FIG. 6.

In FIG. 9, the fill material layer 26 has been etched through the opening 28d in the second contact etch mask 28 such that a portion 24a of the first contact etch mask 24 has been exposed. The etch mask 28 may, as shown in FIG. 9, be partially consumed during the etching. The portion 24a is located above a region of the insulating layer 22 adjacent to the deep portion 124a. The portion 24a is the portion of the first contact etch mask 24 that covers the region of the insulating layer 22 in which the shallow portion 124b will be formed. The etching through the fill material layer 26 has been stopped while a portion 26a of the fill material layer 26 still remains in the deep portion 124a. It should be noted that the particular level of the top surface of the portion 26a merely is one example and that other levels are possible. The portion 26a may, at least however, cover the bottom surface 124ab of the deep portion 124a.

Figures 10, 11:
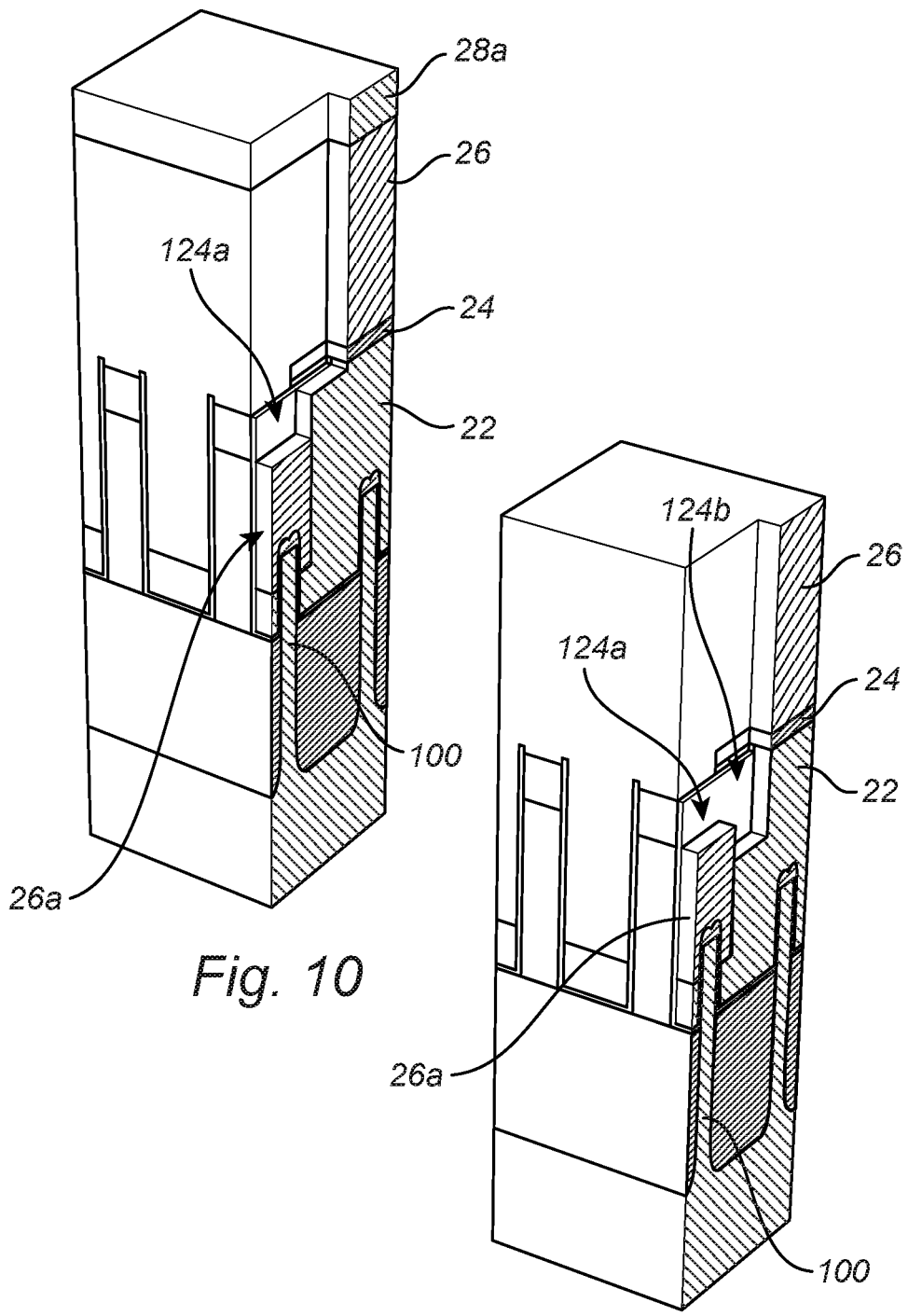
FIG. 10 illustrates another device processing step in the method of forming a semiconductor device, according to an example embodiment.
FIG. 11 illustrates another device processing step in the method of forming a semiconductor device, according to an example embodiment.

In FIG. 10, the portion 24a of the first contact etch mask 24 has been removed to expose the portion of the insulating layer 22 underneath. An enlarged opening has hence been formed in the first contact etch mask 24. The portion 24a may be removed by a short wet or dry etch step.

In FIG. 11, the shallow portion 124b has been formed by etching the insulating layer 22 through the enlarged opening, selectively to the fill material layer portion 26a. For instance, a silicon oxide insulating layer 22 may be etched selectively from an a-C fill material layer portion 26a using a dry etch.

Subsequently, the portion 26a is removed from the deep portion 124a by etching the portion 26a selectively to the insulating layer 22, thereby arriving at the structure shown in FIGS. 7a-c. Also, in this step, a dry etch may be employed.

Figure 12:
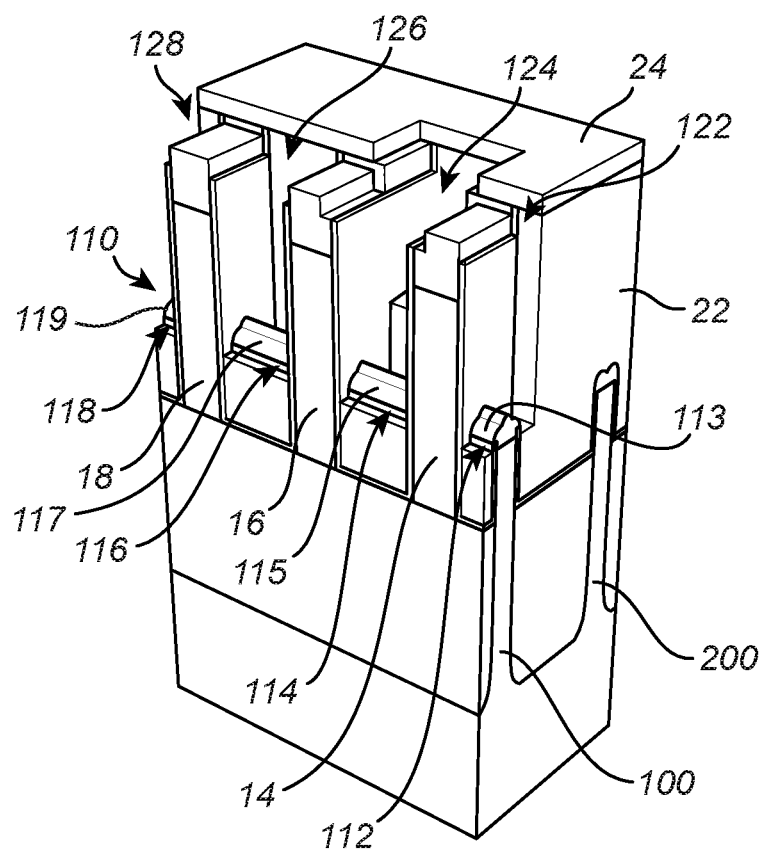
FIG. 12 illustrates another device processing step in the method of forming a semiconductor device, according to an example embodiment.

In FIG. 12, the first set of regions 110 have been exposed. The portions of the first spacer layer 20 covering the first set of regions 110 that are exposed in the first set of source/drain contact openings 120 have been removed. The portions may be removed by an anisotropic vertical etch, such as RIE. Hence, portions of the first spacer layer 20 formed on the sidewalls of the gate structures 14, 16, 18 may remain.

Semiconductor top portions 113, 115, 117, 119 may then be grown in the first set of regions 110 to form doped source/drain regions 112, 114, 116, 118. The semiconductor material forming the top portions may be grown by selective epitaxy, for instance selective Si epitaxy or selective SiGe epitaxy. The grown semiconductor material may be doped with an n-type or p-type dopant, in accordance with the desired type of charge carriers for the transistor devices to be formed along the first fin 100. The semiconductor material may be doped by introducing appropriate impurities in the reaction chamber during the growth process.

Figure 13:
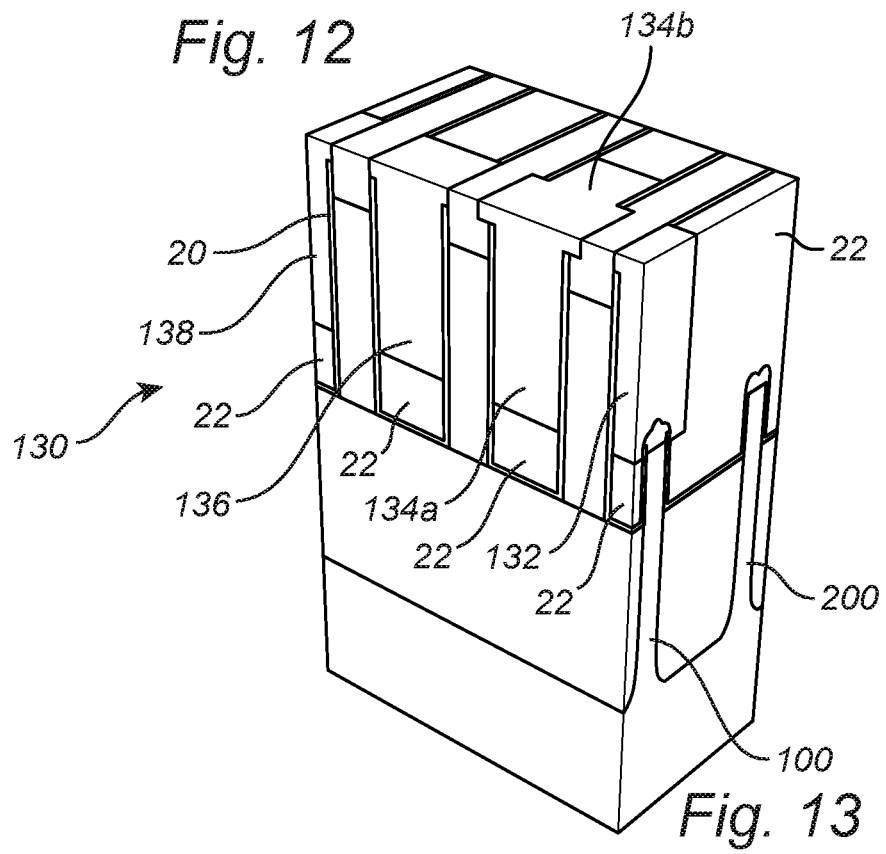
FIG. 13 illustrates another device processing step in the method of forming a semiconductor device, according to an example embodiment.

In FIG. 13, a first set of source/drain contacts 130 has been formed in the first set of source/drain contact openings 120. A respective source/drain contact 132, 134, 136, 138 is formed in a respective one of the source/drain contact openings 122, 124, 126, 128. The top surfaces of the first set of contacts 130 are flush with the top surface of the insulating layer 22. Each of the first set of source/drain contacts 130 extends vertically through the insulating layer 22 into direct (physical and electrical) contact with a respective source/drain region 112, 114, 116, 118.

The first set of source/drain contacts 130 includes the source/drain contact 134, which, in the following, may be referred to as the first source/drain contact 134 (of the first set of source/drain contacts 130). The first source/drain contact 134 is formed in the first source/drain contact opening 124. The first source/drain contact 134 includes a vertically extending contact portion 134a that is arranged in the deep portion 124a of the first source/drain contact opening 124. The contact portion 134a extends into direct (physical and electrical) contact with the (first) source/drain region 114. The first source/drain contact 134 includes a via landing portion 134b that is arranged in the shallow portion 124b of the first source/drain contact opening 124. The via landing portion 134b protrudes from the vertically extending contact portion 134a, in the second horizontal direction Y, towards the second fin 200. This may be seen also in FIGS. 14a and 14b, where FIG. 14b shows in a plan view a cross-section taken along line A-A' indicated in FIG. 14a. The protruding via landing portion 134b extends at the level V3, above the level V4.

Figure 14A:
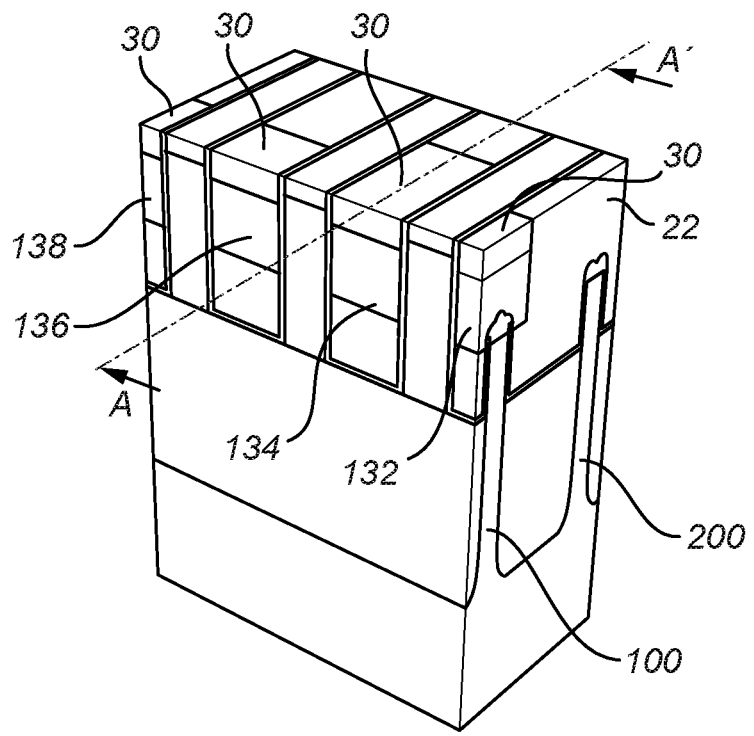
FIG. 14a illustrates another device processing step in the method of forming a semiconductor device, according to an example embodiment.
Figure 14B:
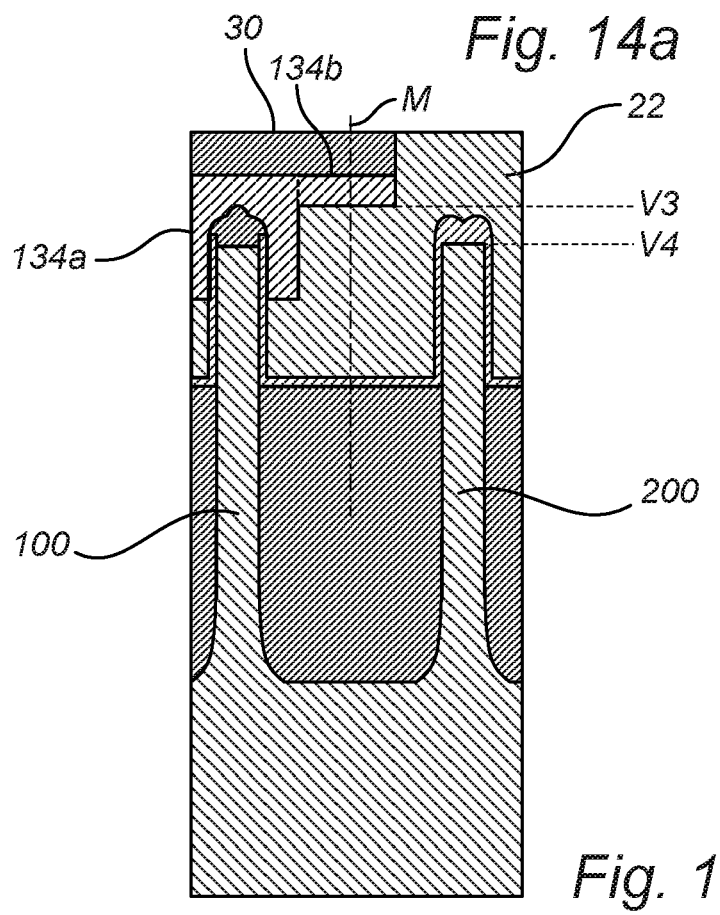
FIG. 14b illustrates a cross-sectional view of the device processing step of FIG. 14a along line A-A', according to an example embodiment.

In FIGS. 14a and 14b, the first set of source/drain contacts 130 have further been recessed, for instance, by a suitable etch process for etching a metal source/drain contact material selectively to the insulating layer 22. The recesses have been filled with a capping layer 30. The capping layer may, for instance, be formed by depositing a SiC layer. Planarization has thereafter been performed to obtain separate capping layer portions, or contact caps 30, on each one of the first set of source/drain contacts 130.

The first set of source/drain contacts 130 may be formed by depositing a conductive layer of one or more conductive materials in the first set of source/drain contact openings 120. For instance, a layer of metal, such as Ti, TiN, WN, or an alloy of two or more thereof, may be deposited by ALD, CVD, or physical vapor deposition (PVD). Optionally, a further layer of, for instance, W, Co, Ni, Ru, or an alloy of two or more thereof, may be deposited on top of the first deposited conductive layer. The (single or composite) conductive layer may be deposited to completely fill the first set of source/drain contact openings 120 and cover upper surfaces of the insulating layer 22. Overburden conductive layer portions (i.e., conductive layer portions outside of the first set of source/drain contact openings 120) may thereafter be removed by CMP and/or etched back to expose the insulating layer 22, as shown in FIG. 13. It is also possible to deposit the conductive layer to only partially fill the first set of source/drain contact openings 120 and thereafter planarize the structure to obtain a structure similar to that in FIG. 13 with the top surfaces of the first set of contacts 130 flush with the top surface of the insulating layer 22.

In FIG. 15a, a second set of source/drain contact openings 220 has been formed in the insulating layer 22. FIG. 15b shows a cross section taken along line B-B' indicated in FIG. 15a. Each opening 222, 224, 226, 228 of the second set of source/drain contact openings 220 is formed above a respective region of the second set of regions 210. The opening 222 is formed above the region 212. The opening 224 is formed above the region 214, i.e., the region denoted "first region 214" above. The opening 226 is formed above the region 216. The opening 228 is formed above the region 218.

The opening 226 of the second set of source/drain contact openings 220 may, in the following, be referred to as the second source/drain contact opening 226 (of the second set 220). The region 216 of the second set of regions 210 may correspondingly, in the following, be referred to as the second region 216 (of the second fin 200).

The second source/drain contact opening 226 of the second set 220 is formed in a manner corresponding to the first source/drain contact opening 124 of the first set 120. More specifically, the second opening 226 includes a deep portion 226a and a shallow portion 226b.

The deep portion 226a is formed directly above the second region 216 and extends vertically through the insulating layer 22, such that a level V5 of a bottom surface 226ab of the deep portion 226a (formed by a remaining thickness portion of the insulating layer 22 under the deep portion 226a) is located at or below a level V6b of the second region 216. The level V6b may correspond to the level of the top surface of the fin 200. The region 216 of the fin 200 thus protrudes above the bottom surface 226ab. However, it is also possible to form the deep portion 226a such that the levels V5 and V6b coincide. It is also possible to form the deep portion 226a such that the level V5 is located at or below a level V6a of the top surface of the first spacer layer portion 20 on the second region 216. This may still allow the second region 216 to be accessed by removing the top first spacer layer portion 20 at a later stage of the process.

The shallow portion 226b is formed adjacent to the deep portion 226a and extends vertically through the insulating layer 22 such that a level V7 of a bottom surface 226bb of the shallow portion 226b (formed by a remaining thickness portion of the insulating layer 22 under the shallow portion 226b) is located above a level V8 of the directly opposite second region 116 of the first fin 100. In cases where semiconductor top portions have then been grown in first set of regions 110 as described above, the level V8 may, as shown, correspond to the level of the top of the semiconductor top portions. Otherwise, the level V8 may correspond to the level of the top surface of the first fin 100.

In any case, the shallow portion 226b protrudes from the deep portion 226a in a third horizontal direction (opposite the second horizontal direction Y) towards the second region 116 of the first fin 100. The shallow portion 226b protrudes to and, optionally as shown, slightly past a horizontal position disposed halfway between the second fin 200 and the first fin 100.

The above discussion concerning the depth of the deep portion 226a applies correspondingly to the further source/drain contact openings of the second set 220. Accordingly, the openings 222, 224, 228 may each present corresponding bottom surfaces formed at a level at or below a level of the respective region 212, 214, 218 of the fin 200, or at or below a level of the top surface of the first spacer layer portion 20 on the respective region 212, 214, 218. More specifically, the openings 222, 224, 228 and the deep portion 226a may all be formed to present bottom surfaces located at a same level, e.g., level V5. The level V5 may coincide (at least approximately) with the level V1.

The second set of source/drain contact openings 220, including the second source/drain contact opening 226 may be formed in a manner corresponding to the process steps described in connection with the forming of the first set of source/drain contact openings 120 and the first source/drain contact opening 124a, 124b. That is, such openings may be formed by forming an opening in a third contact etch mask 32, the opening extending along the second fin 200, above each region 212, 214, 216, 218 of the second set of regions 210, and thereafter etching the insulating layer 22 through the opening. The shallow portion 226b may be formed adjacent to the deep portion 226a in a manner corresponding to the forming of the shallow portion 124b adjacent to the deep portion 124a. A fill material layer (corresponding to fill material layer 26) may be deposited to fill the deep portion 226a and cover the third contact etch mask 32. Using a fourth contact etch mask (corresponding to the second contact etch mask 28) formed on the fill material layer, a portion of the third contact etch mask 32 being formed above a region of the insulating layer 22 in which the shallow portion 226b is to be formed, may be removed by etching to form an enlarged opening in the third contact etch mask 32. The shallow portion 226b may thereafter be formed by etching the insulating layer 22 through the enlarged opening, selectively to the fill material layer portion. Subsequently, fill material in the deep portion 226a may be removed by etching the fill material selectively to the insulating layer 22.

Figure 15C:
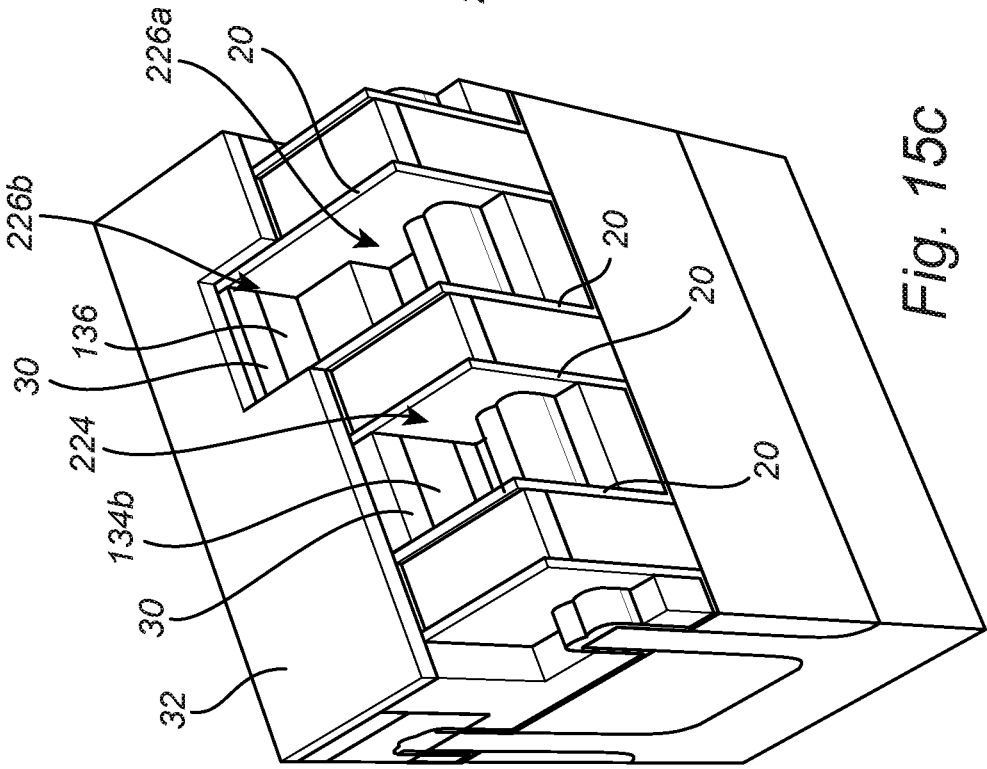
FIG. 15c illustrates a rotated view of the device processing step of FIG. 15a, according to an example embodiment.

FIG. 15c shows a slightly rotated view compared to FIG. 15a. As shown in FIG. 15c, the forming of the first source/drain contact opening 224 may result in an end portion of the protruding via landing portion 134b of the first source/drain contact 134 being exposed. Correspondingly, the forming of the first source/drain contact opening 226, especially the shallow portion 226b thereof, may result in the source/drain contact 136 of the first set of source/drain contacts 130 being exposed in the shallow portion 226b. Even if the source/drain contact 136 or the protruding via landing portion 134b does not become exposed, a remaining thickness of the insulating layer 22 between the respective contacts and the contact openings 224 or 226 may still be too thin to provide sufficient electrical insulation between the contacts 134, 136 and the source/drain contacts, which are to be formed in the second set of source/drain contact openings 220.

Figure 16:
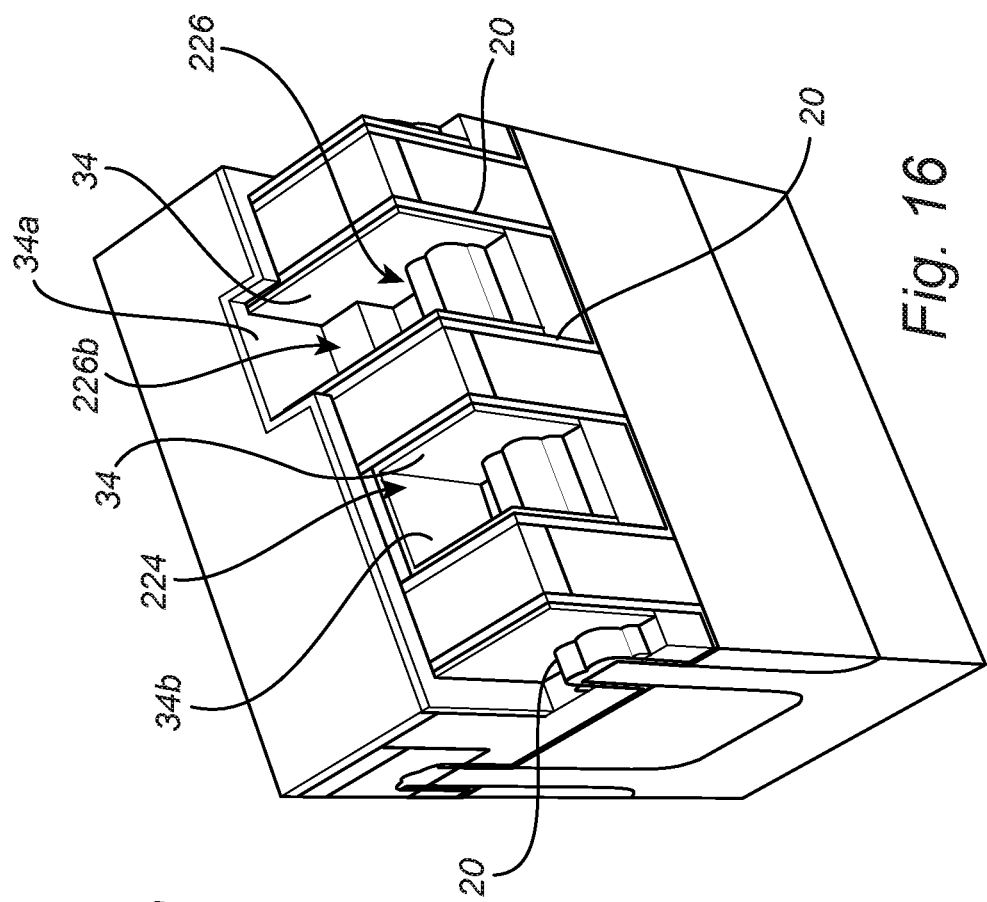
FIG. 16 illustrates another device processing step in the method of forming a semiconductor device, according to an example embodiment.

To reduce the risk of contact-shorting, an insulating contact spacer layer 34 (or interchangeably referred to as a second spacer layer 34) may, as shown in FIG. 16, be formed on the sidewalls of the second set of source/drain contact openings 220 prior to forming the second set of source/drain contacts 230 in the second set of source/drain contact openings 220. A portion 34b of the contact spacer layer 34 may provide (increased) insulation between the via landing portion 134b and the source/drain contact opening 224. A portion 34a of the contact spacer layer 34 may provide (increased) insulation between the source/drain contact 136 and the shallow portion 226b.

The contact spacer layer 34 may be formed by depositing a conformal contact spacer layer covering exposed surfaces of the structure, for instance by ALD. An anisotropic vertical etch of the contact spacer layer 34 may be performed to remove portions formed on horizontal surfaces, such that the contact spacer layer 34 remains on the sidewalls in the second set of source/drain contact openings 220. The contact spacer layer 34 may, for instance, be a suitable nitride-based material, e.g., an ALD nitride-based material, for instance, $Si_xN_y$ or $Si_xN_yO_z$ with x=3 and y=4.

Figure 17:
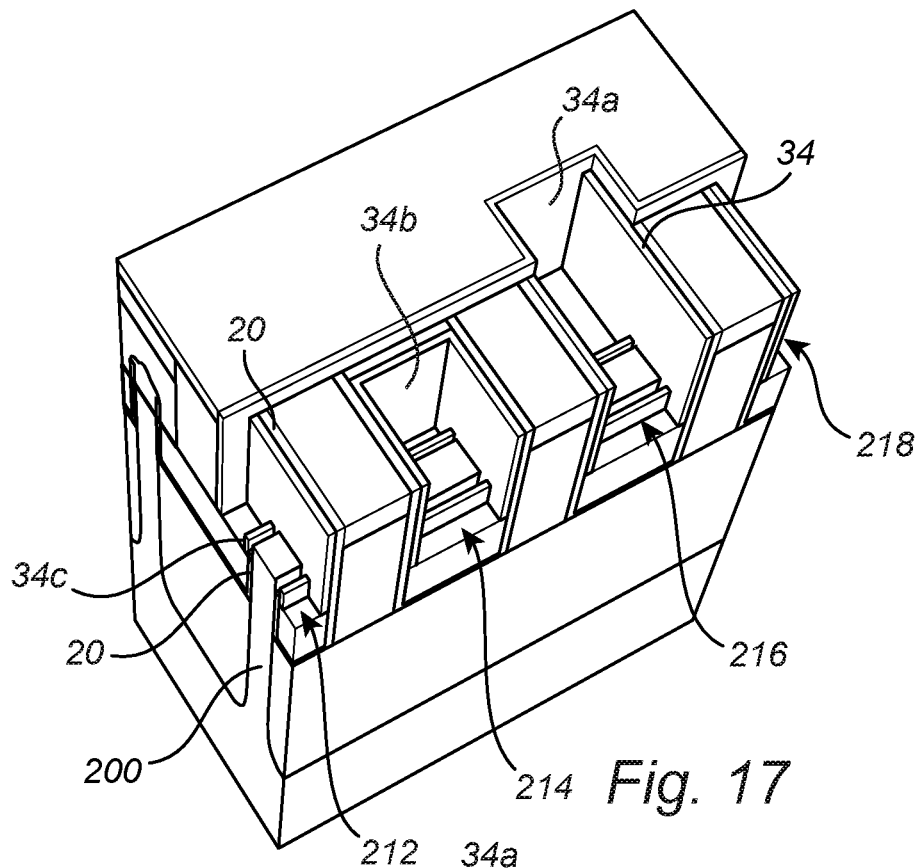
FIG. 17 illustrates another device processing step in the method of forming a semiconductor device, according to an example embodiment.

In FIG. 17, the second set of regions 210 have been exposed. The portions of the first spacer layer 20 covering the second set of regions 210 that are exposed in the first set of source/drain contact openings 120 have been removed. Moreover, portions of the contact spacer layer 34 covering the second set of regions 210 may also be removed if present. The portions may be removed by an anisotropic vertical etch, such as a RIE.

Figure 18:
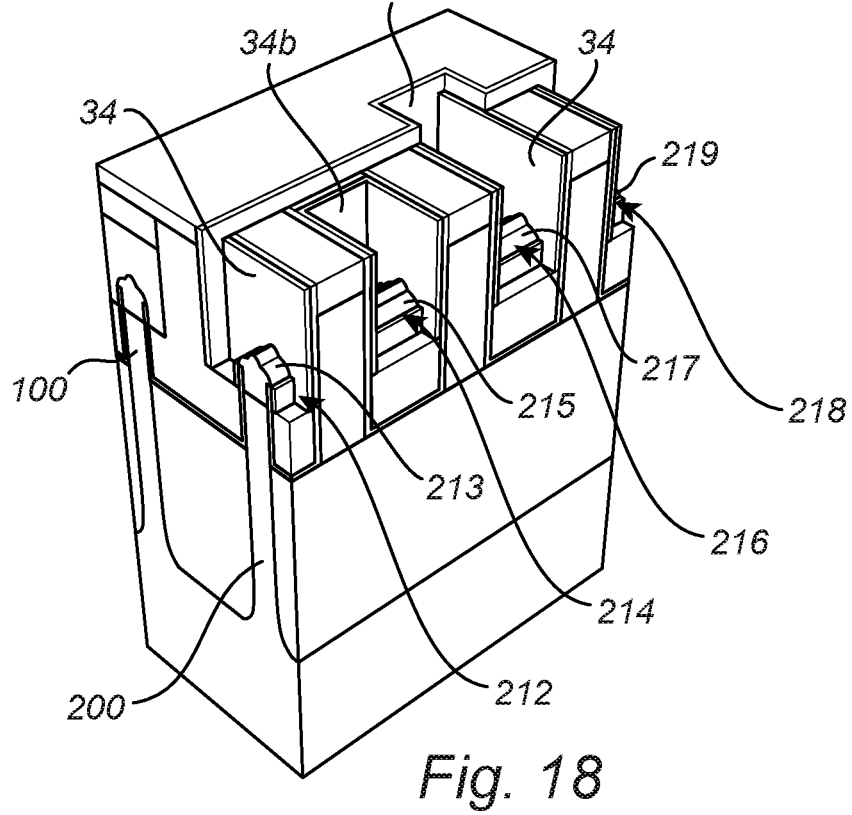
FIG. 18 illustrates another device processing step in the method of forming a semiconductor device, according to an example embodiment.

As shown in FIG. 18, semiconductor top portions 213, 215, 217, 219 may then be grown in the second set of regions 210 to form doped source/drain regions 212, 214, 216, 218. The portions may be formed in a similar manner as those formed in the first set of regions 110.

Figure 19A:
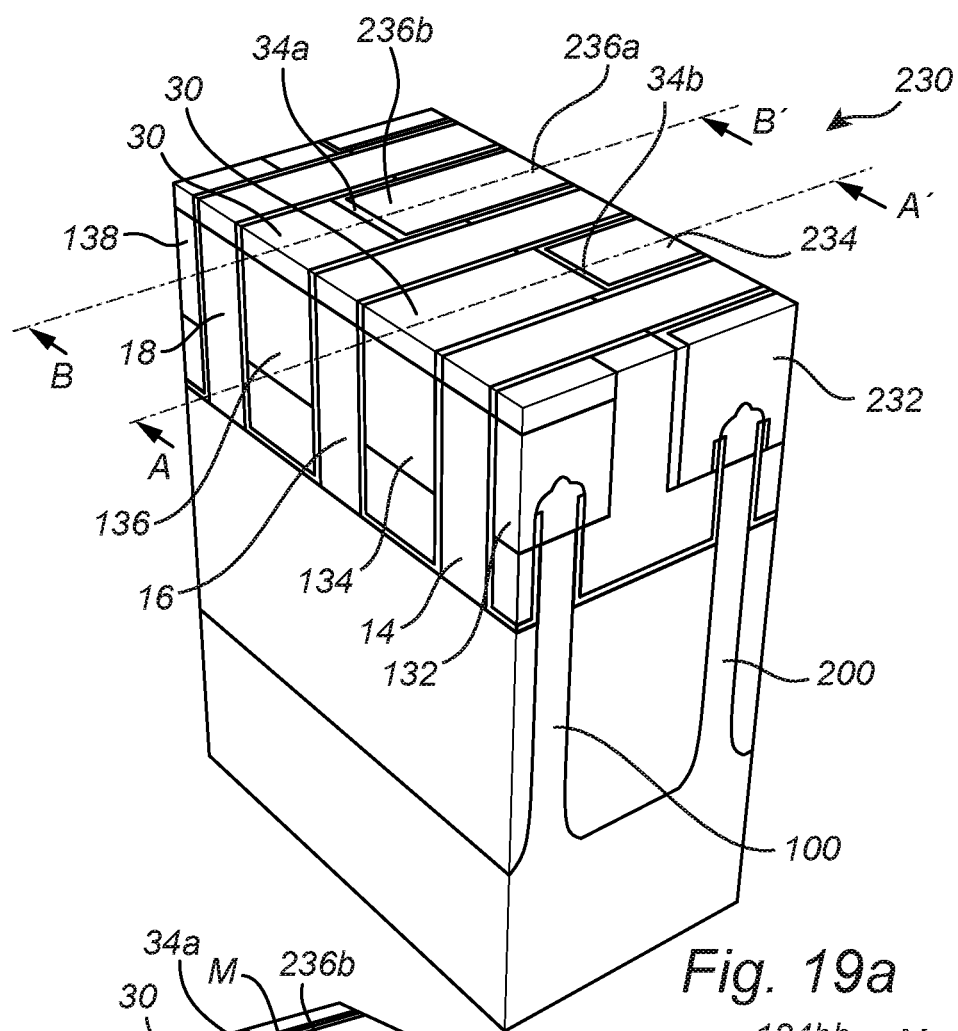
FIG. 19a illustrates another device processing step in the method of forming a semiconductor device, according to an example embodiment.

In FIG. 19a, a second set of source/drain contacts 230 has been formed in the second set of source/drain contact openings 220. The second set of contacts 230 may be formed in a manner corresponding to the first set of contacts 130 by depositing a conductive material in the second set of source/drain contact openings 220.

A respective source/drain contact 232, 234, 236, 238 is formed in a respective one of the source/drain contact openings 222, 224, 226, 228. The top surfaces of the second set of contacts 130 are flush with the top surface of the insulating layer 22. Each of the second set of source/drain contacts 230 extends vertically through the insulating layer 22 into direct (physical and electrical) contact with a respective source/drain region 212, 214, 216, 218.

The second set of source/drain contacts 230 includes the source/drain contact 236, which, in the following, may be referred to as the second source/drain contact 236 (of the second set of source/drain contacts 230). The second source/drain contact 236 is formed in the second source/drain contact opening 226. The second source/drain contact 236 includes a vertically extending contact portion 236a that is arranged in the deep portion 226a of the second source/drain contact opening 226. The contact portion 236a extends into direct (physical and electrical) contact with the (second) source/drain region 216. The second source/drain contact 236 includes a via landing portion 236b that is arranged in the shallow portion 226b of the second source/drain contact opening 226. The via landing portion 236b protrudes from the vertically extending contact portion 236a in a horizontal direction towards the first fin 100.

Figure 19B:
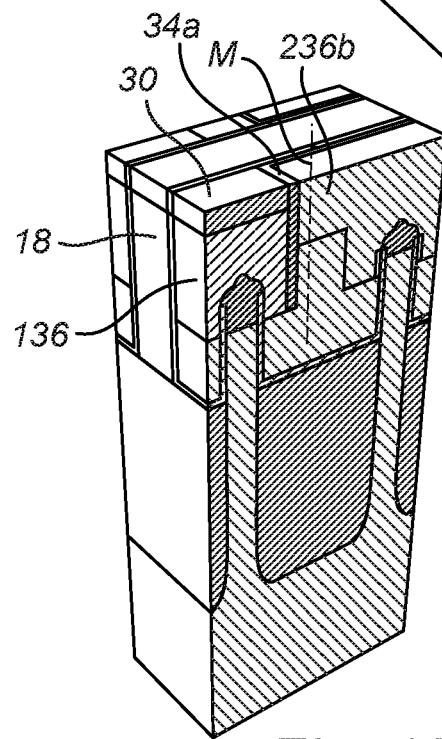
FIG. 19b illustrates the device processing step of FIG. 19a cross-sectioned along line B-B', according to an example embodiment.
Figure 19C:
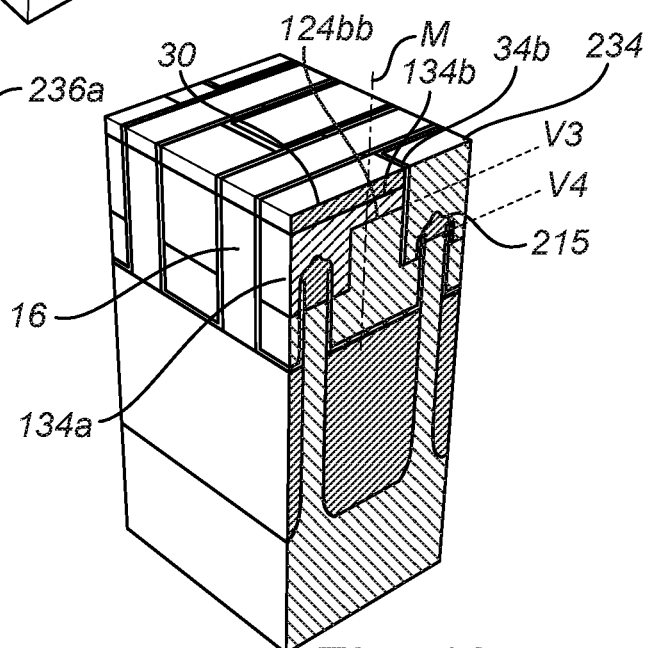
FIG. 19c illustrates the device processing step of FIG. 19a cross-sectioned along line A-A', according to an example embodiment.

The configuration of the contacts 134 and 236 may be seen more clearly in FIGS. 19b and 19c. FIG. 19b shows a cross-section taken along line B-B' indicated in FIG. 19a. The portion 34a of the contact spacer layer 34 provides insulation between the source/drain contact 136 and the via landing portion 236b. FIG. 19c shows a cross-section taken along line A-A' indicated in FIG. 19a. The portion 34b of the contact spacer layer 34 provides insulation between the source/drain contact 234 and the via landing portion 134b.

In the above, the first region 114 of the first fin 100 and the second region 216 of the second fin 200 are regions formed on opposite sides of a same gate structure 16. However, the first region 114 and the second region 216 may also be separated by more than one gate structure. For instance, a contact corresponding to the contact 134 and including a vertically extending contact portion and a via landing portion may instead (or additionally) be formed above the region 112. Additionally or alternatively, a contact corresponding to the contact 236 and including a vertically extending contact portion and a via landing portion may instead (or additionally) be formed, for instance, above the region 218.

Figure 20:
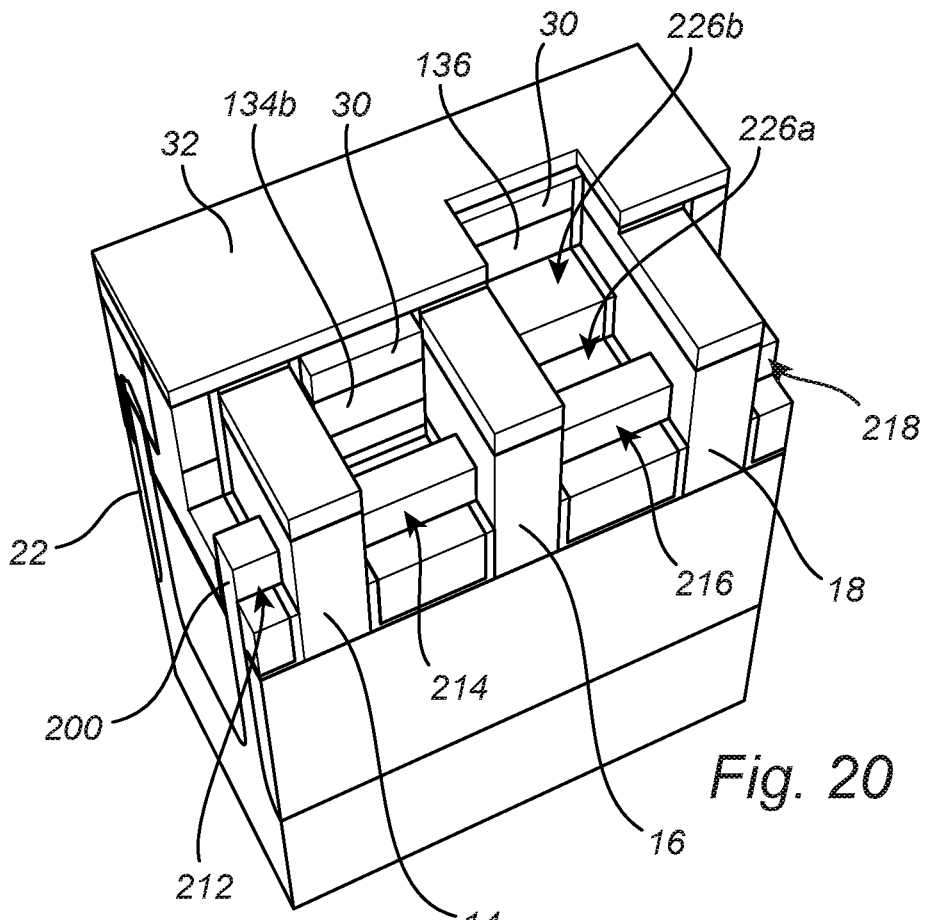
FIG. 20 illustrates a device processing step in a variation of the method of forming a semiconductor device, according to an example embodiment.
Figure 21:
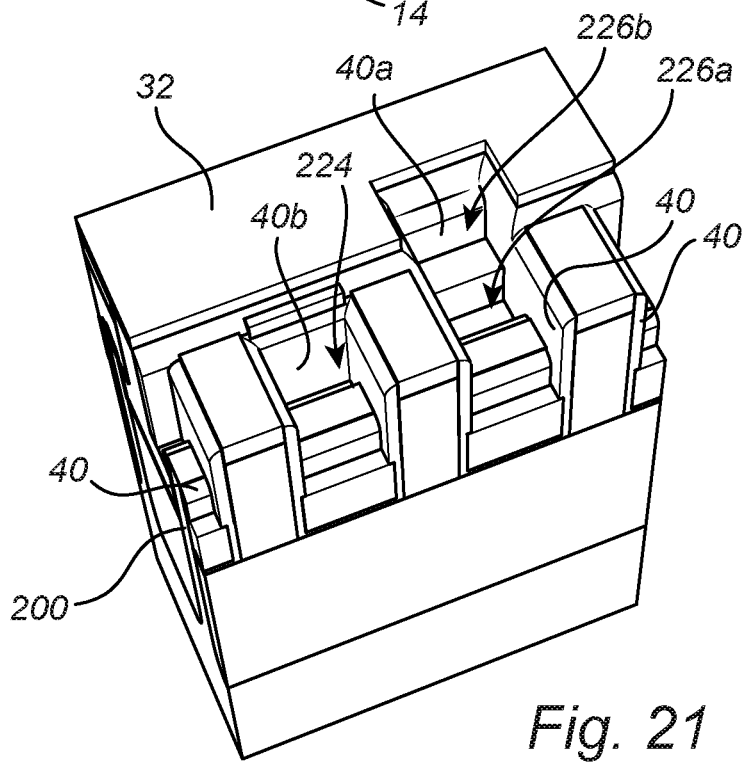
FIG. 21 illustrates another device processing step in the variation of the method of forming a semiconductor device, according to an example embodiment.
Figure 22:
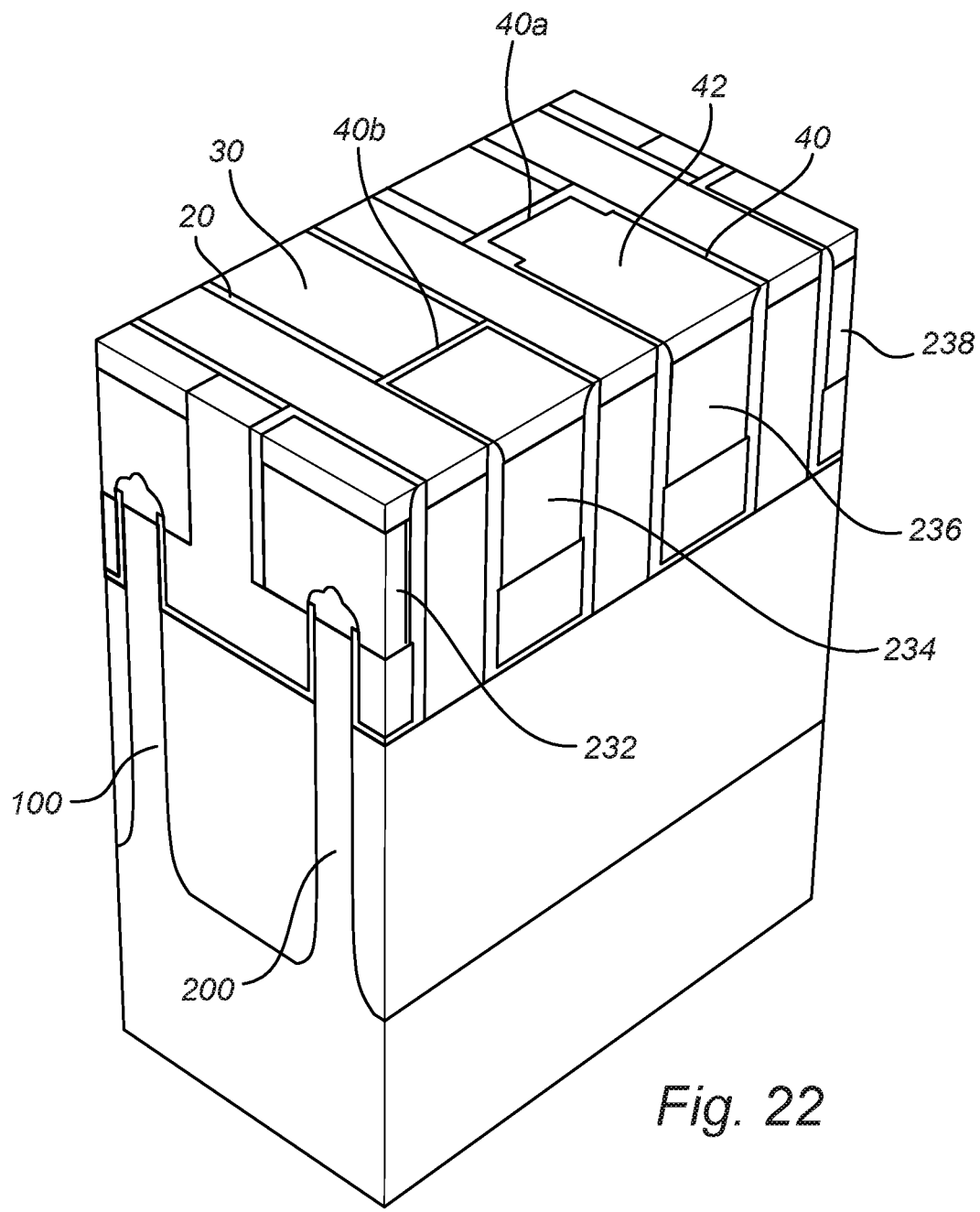
FIG. 22 illustrates another device processing step in the variation of the method of forming a semiconductor device, according to an example embodiment.

FIGS. 20-22 show a variation of a process flow for forming a contact spacer layer in the second set of source/drain contact openings 220. According to this variation, the portions of the first spacer layer 20 formed on sidewalls of the gate structures 14, 16, 18 inside the second set of source/drain contact openings 220 are removed (see FIG. 20) prior to forming an insulating contact spacer layer 40 (interchangeably referred to as the second spacer layer 40) on the sidewalls of the source/drain contact openings 220 (see FIG. 21). The portions of the first spacer layer 20 may be removed by an isotropic etch. Any conventional wet etching chemistry allowing etching of the material forming the first spacer layer 20 may be used. The etching of the first spacer layer 20 may also result in removal of portions of the first spacer layer 20 formed on the fin 200, including the portions covering the second set of regions 210. As indicated in FIG. 21, the etching of the first spacer layer 20 may result in a slight recess of the insulating layer 22.

The contact spacer layer 40 may be formed in a corresponding manner as the contact spacer layer 34 and provides a corresponding function as the contact spacer layer 34. It could be made of an ALD dielectric, for instance, $SiO_2$, SiOC, SiOCN, SiBCN, SiON or SiN. However, as the first spacer layer 20 is removed from the sidewalls of the gate structures 14, 16, 18 prior to deposition of the contact spacer layer 40, a volume of the second set of contact openings may be reduced to a smaller extent than in the scenario depicted in FIG. 16.

With reference to FIG. 21, a portion 40b of the contact spacer layer 40 may provide (increased) insulation between the via landing portion 134b and the source/drain contact opening 224. A portion 40a of the contact spacer layer 40 may provide (increased) insulation between the source/drain contact 136 and the shallow portion 226b.

In FIG. 22, the second set of source/drain contacts 230 has been formed in the second set of source/drain contact openings 220, following forming of the top portions 213, 215, 217, 219.

A capping layer 42 has been formed on the second set of source/drain contacts 230 in a corresponding manner as the capping layer 30 disclosed above.

In FIG. 23a, an interconnection level 300 has been formed above the device level including the fins 100, 200, the gate structures 14, 16, 18, and the contacts 130, 230. FIG. 23b shows a cross section along line C-C' indicated in FIG. 23a. The interconnection level 300 may be formed above either the structure shown in FIG. 19 or the structure shown in FIG. 22. An interlayer dielectric embedding the interconnection level 300 has been omitted from FIGS. 23a and 23b to allow a view of the structure. The interconnection level 300 includes a horizontal line or routing track 330 formed at a horizontal position halfway between the first and second fins 100, 200. A first vertical via 310 is formed to extend directly between the horizontal line 330 and the via landing portion 134b. A second vertical via 320 is formed to extend directly between the horizontal line 330 and the via landing portion 236b. Hence, a cross-coupling of the first source/drain contact 124 on the first fin 100 and the second source/drain contact 236 on the second fin 200 has been formed.

The interconnection level 300 may be formed using conventional damascene style processing, such as a dual damascene process. In cases where the gate structures 14, 16, 18 are sacrificial gate structures, prior to forming the interconnection level 300, a replacement metal gate process may be performed in a conventional manner to replace the set of sacrificial gate structures with a set of replacement gate structures 14, 16, 18.

Figure 24:
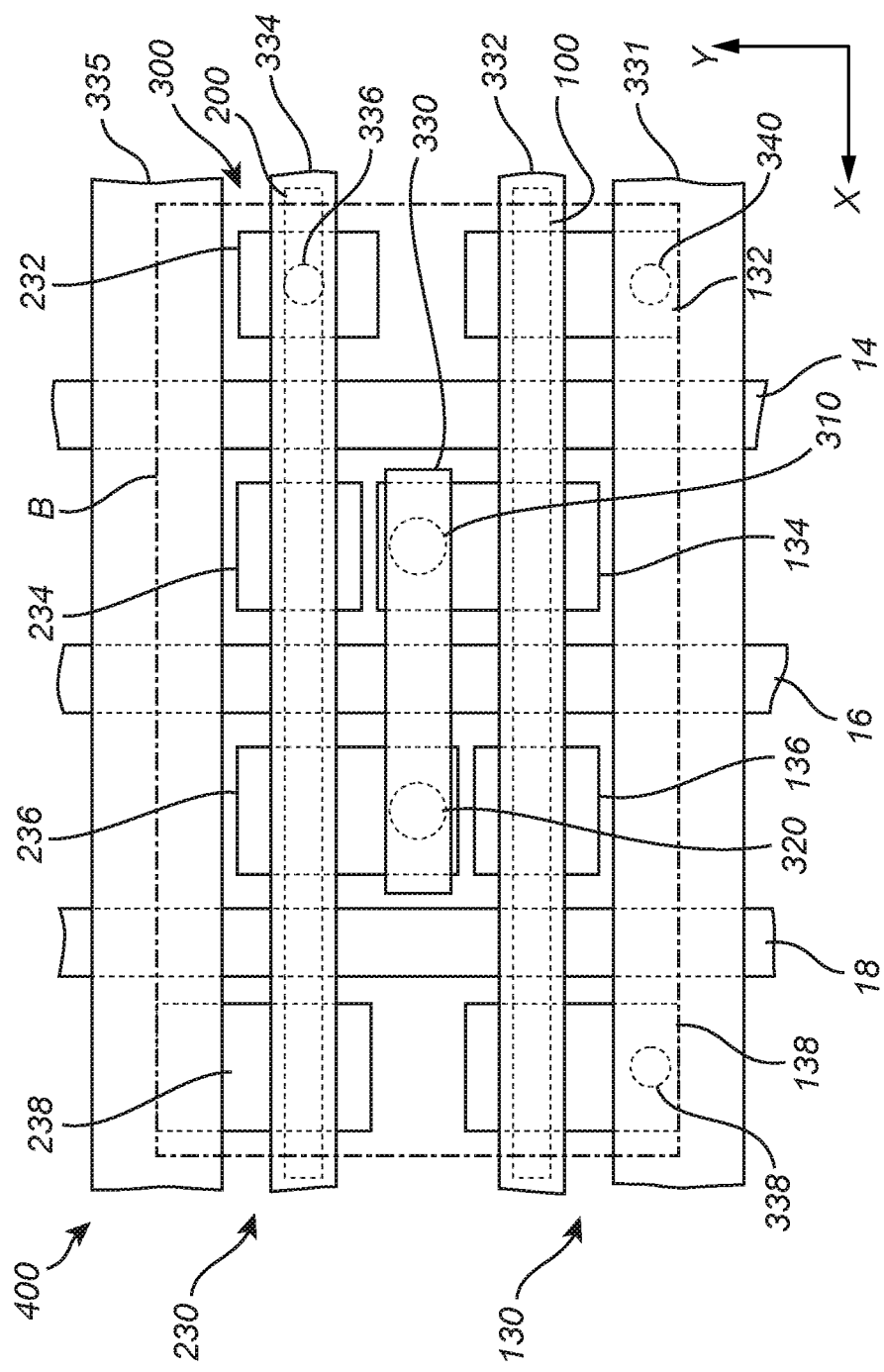
FIG. 24 illustrates a functional cell, according to an example embodiment.

FIG. 24 is a schematic top-down view of a functional cell 400 including the first fin 100 and the second fin 200 with the respective sets of source/drain contacts 130, 230 formed thereon. The dashed line B indicates a cell boundary between the cell 400 and neighboring cells. As shown, the interconnection level 300 may, in addition to the routing track 330 forming a middle track of the cell 400, include routing tracks running parallel to the routing track 330. The interconnection level 300 may, for instance, include a routing track 332 formed at a horizontal position directly above the first fin 100. The interconnection level 300 may alternatively or additionally include a routing track 334 formed at a horizontal position directly above the second fin 200. These "off-center" routing tracks 332 and/or 334 may be tapped (i.e., connected) to selected ones of the source/drain contacts 130, 230 by respective vertical vias of the interconnection level 300, as shown by schematically indicated via 336. The routing tracks 332 and/or 334 may also be tapped to selected ones of the gate structures 14, 16, 18 in a corresponding manner.

The interconnection level 300 may include a pair of edge routing tracks 331, 335 overlapping the cell boundary B on mutually opposite sides of the cell 400. By this arrangement, the edge routing tracks may be shared between neighboring cells. The edge routing tracks 331, 335 may, for instance, form power tracks for the cell 400, such as a VSS track and VDD track, respectively. The edge routing tracks 331, 335 may be tapped to selected ones of the source/drain contacts 130, 230. For instance, as shown, contacts 132, 138, and 238 may present a lateral extension, such that the routing tracks 331, 335 extend directly above. The contacts 132, 138, and 238 may thus be connected to the routing tracks 331, 335 by respective vertical vias of the interconnection level 300, as shown by via 338.

The tracks 331, 332, 330, 334, 335 may be regularly spaced along the direction Y. The cell 400 has only three tracks available for internal routing. As may be understood, the exact configuration of the intra-cell routing and connection points for the power rails will depend on the intended function of the functional cell 400. Moreover, further interconnection levels may be formed above the interconnection level 300 and include routing tracks, for instance, for providing inter-cell routing, providing drive and gate voltages, etc.

In the above, the present disclosure has mainly been described with reference to a limited number of examples. However, as is readily appreciated by a person skilled in the art, other examples than the ones disclosed above are also possible within the scope of the present disclosure, as defined by the appended claims. For instance, although, in the above, reference has been made to a first and a second fin 100, 200, it should be noted that other configurations are possible for the first and second semiconductor structures 100, 200. For instance, each of the first and the second semiconductor structures 100, 200 may present, along at least a part of its length, a shape in the form of a set of horizontally extending nanowires or nanosheets arranged above each other and being suspended above the substrate 10. The suspended portions of the first and the second semiconductor structures 100, 200 may be tethered to non-suspended semiconductor portions below a first set of regions 110 and a second set of regions 210, such regions being discussed above. Such nanowire or nanosheet structures may be formed by etching away thickness portions of semiconductor fins, using conventional techniques. The nanowire and nanosheet portions may form transistor channel portions that allow the gate structures to wrap-around the channels.

What is claimed is:

1. A method comprising:
    forming, in an insulating layer, a first set of source/drain contact openings, wherein the insulating layer covers:
        (i) a first elongated semiconductor structure extending in a first horizontal direction along a substrate and protruding vertically above the substrate, and (ii) a second elongated semiconductor structure extending along the substrate in parallel with the first semiconductor structure and protruding vertically above the substrate, wherein the first set of source/drain contact openings are formed above a first set of regions of an upper portion of the first semiconductor structure,
    wherein forming the first set of source/drain contact openings comprises forming a first source/drain contact opening above a first region of the first set of regions of the first semiconductor structure, wherein the first source/drain contact opening includes: (i) a first deep portion formed directly above the first region of the first semiconductor structure, and (ii) a first shallow portion formed adjacent to the first deep portion and extending vertically through the insulating layer, such that a level of a bottom surface of the first shallow portion is located above a level of a directly opposite first region of an upper portion of the second semiconductor structure, wherein the first shallow portion protrudes from the first deep portion in a second horizontal direction towards the first region of the second semiconductor structure and to a horizontal position disposed at least halfway between the first semiconductor structure and the second semiconductor structure;
    wherein forming the first source/drain contact opening comprises:
        forming the first deep portion by etching the insulating layer above the first region of the first semiconductor structure,
        filling, at least partially, the first deep portion with a fill material,
        forming the first shallow portion by etching the insulating layer selectively to the fill material adjacent to the first deep portion, and
        removing the fill material in the first deep portion by etching the fill material selectively to the insulating layer;
    forming a first set of source/drain contacts in the first set of source/drain contact openings, wherein forming the first set of source/drain contacts comprises forming a first source/drain contact in the first source/drain contact opening, wherein the first source/drain contact includes: (i) a first vertically extending contact portion arranged in the first deep portion and (ii) a first via landing portion arranged in the first shallow portion and protruding horizontally from the first vertically extending contact portion; and
    forming an interconnection level, the interconnection level including a first vertical via abutting the first via landing portion.

2. The method according to claim 1, wherein a set of gate structures extends across the first semiconductor structure and the second semiconductor structure, wherein the set of gate structures are embedded by the insulating layer, and wherein each of the regions of the first semiconductor structure and the second semiconductor structure is a region formed adjacent to at least one gate structure of the set of gate structures.

3. The method according to claim 1, further comprising:
    subsequent to forming the first set of source/drain contact openings and prior to forming the first set of source/drain contacts, epitaxially growing a respective doped semiconductor top portion in each region of the first set of regions.

4. The method according to claim 1, wherein forming the first set of source/drain contacts comprises depositing a contact material in the first set of source/drain openings, and wherein the method further comprises forming a capping layer on the first set of source/drain contacts.

5. The method according to claim 1, wherein the first semiconductor structure and, the second semiconductor structure form part of a functional cell, wherein forming the interconnection level comprises forming the interconnection level to include a middle routing track extending in the first horizontal direction and arranged at a horizontal position halfway between the first and second semiconductor structures, and wherein the middle routing track abuts the first vertical via.

6. A method comprising:
  forming, in an insulating layer, a first set of source/drain contact openings, wherein the insulating layer covers: (i) a first elongated semiconductor structure extending in a first horizontal direction along a substrate and protruding vertically above the substrate, and (ii) a second elongated semiconductor structure extending along the substrate in parallel with the first semiconductor structure and protruding vertically above the substrate, wherein the first set of source/drain contact openings are formed above a first set of regions of an upper portion of the first semiconductor structure,
  wherein forming the first set of source/drain contact openings comprises forming a first source/drain contact opening above a first region of the first set of regions of the first semiconductor structure, wherein the first source/drain contact opening includes: (i) a first deep portion formed directly above the first region of the first semiconductor structure, and (ii) a first shallow portion formed adjacent to the first deep portion and extending vertically through the insulating layer, such that a level of a bottom surface of the first shallow portion is located above a level of a directly opposite first region of an upper portion of the second semiconductor structure, wherein the first shallow portion protrudes from the first deep portion in a second horizontal direction towards the first region of the second semiconductor structure and to a horizontal position disposed at least halfway between the first semiconductor structure and the second semiconductor structure;
  wherein forming the first source/drain contact opening comprises:
    forming, on the insulating layer, a first contact etch mask that includes a first opening above the first region of the first semiconductor structure,
    forming the first deep portion by etching the insulating layer through the first opening,
    depositing a fill material layer covering the first contact etch mask and filling the first deep portion,
    forming, on the fill material layer, a second contact etch mask that includes a second opening above a region of the insulating layer adjacent to the first deep portion,
    etching the fill material layer through the second opening, such that (i) a portion of the first contact etch mask formed above the region of the insulating layer adjacent to the first deep portion is exposed and (ii) a portion of the fill material layer remains in the first deep portion,
    removing the portion of the first contact etch mask to expose the region of the insulating layer adjacent to the first deep portion, thereby fixating an enlarged opening in the first contact etch mask,
    forming the first shallow portion by etching the insulating layer through the enlarged opening selectively to the fill material layer portion, and
    removing the fill material in the first deep portion by etching the fill material selectively to the insulating layer;
  forming a first set of source/drain contacts in the first set of source/drain contact openings, wherein forming the first set of source/drain contacts comprises forming a first source/drain contact in the first source/drain contact opening, wherein the first source/drain contact includes: (i) a first vertically extending contact portion arranged in the first deep portion and (ii) a first via landing portion arranged in the first shallow portion and protruding horizontally from the first vertically extending contact portion; and
  forming an interconnection level, the interconnection level including a first vertical via abutting the first via landing portion.

7. The method according to claim 6, wherein a set of gate structures, extends across the first semiconductor structure and the second semiconductor structure, wherein the set of gate structures are embedded by the insulating layer, and wherein each of the regions of the first semiconductor structure and the second semiconductor structure is a region formed adjacent to at least one gate structure of the set of gate structures.

8. The method according to claim 6, further comprising:
  subsequent to forming the first set of source/drain contact openings and prior to forming the first set of source/drain contacts, epitaxially growing a respective doped semiconductor top portion in each region of the first set of regions.

9. The method according to claim 6, wherein forming the first set of source/drain contacts comprises depositing a contact material in the first set of source/drain openings, and wherein the method further comprises forming a capping layer on the first set of source/drain contacts.

10. The method according to claim 6, wherein the first semiconductor structure and the second semiconductor structure form part of a functional cell, wherein forming the interconnection level comprises forming the interconnection level to include a middle routing track extending in the first horizontal direction and arranged at a horizontal position halfway between the first and second semiconductor structures, and wherein the middle routing track abuts the first vertical via.

11. A method comprising:
  forming, in an insulating layer, a first set of source/drain contact openings, wherein the insulating layer covers: (i) a first elongated semiconductor structure extending in a first horizontal direction along a substrate and protruding vertically above the substrate, and (ii) a second elongated semiconductor structure extending along the substrate in parallel with the first semiconductor structure and protruding vertically above the substrate, wherein the first set of source/drain contact openings are formed above a first set of regions of an upper portion of the first semiconductor structure,
  wherein forming the first set of source/drain contact openings comprises forming a first source/drain contact opening above a first region of the first set of regions of the first semiconductor structure, wherein the first source/drain contact opening includes: (i) a first deep portion formed directly above the first region of the first semiconductor structure, and (ii) a first shallow portion formed adjacent to the first deep portion and extending vertically through the insulating layer, such that a level of a bottom surface of the first shallow portion is located above a level of a directly opposite first region of an upper portion of the second semiconductor structure, wherein the first shallow portion protrudes from the first deep portion in a second horizontal direction towards the first region of the second semiconductor structure and to a horizontal position disposed at least halfway between the first semiconductor structure and the second semiconductor structure;

forming a first set of source/drain contacts in the first set of source/dram contact openings, wherein forming the first set of source/drain contacts comprises forming a first source/drain contact in the first source/drain contact opening, wherein the first source/drain contact includes: (i) a first vertically extending contact portion arranged in the first deep portion and (ii) a first via landing portion arranged in the first shallow portion and protruding horizontally from the first vertically extending contact portion;

forming, in the insulating layer, a second set of source/strain contact openings above a second set of regions of the upper portion of the second semiconductor structure;

subsequent to forming the second set of source/drain contact openings, forming a contact spacer layer on one or more sidewalls of the second set of source/drain contact openings;

subsequent to forming the contact spacer layer, forming a second set of source/drain contacts in the second set of source/drain contact openings; and forming an interconnection level, the interconnection level including a first vertical via abutting the first via landing portion.

12. The method according to claim 11, wherein a set of gate structures extends across the first semiconductor structure and the second semiconductor structure, wherein the set of gate structures are embedded by the insulating layer, and wherein each of the regions of the first semiconductor structure and the second semiconductor structure is a region formed adjacent to at least one gate structure of the set of gate structures.

13. The method according to claim 12, wherein the first, region of the first set of regions of the first semiconductor structure and the first region of the second set of regions of the second semiconductor structure are formed on a first side of a first gate structure of the set of gate structures, and wherein a second region of the first set of regions of the first semiconductor structure and a second region of the second set of regions of the second semiconductor structure are formed on a second side of the first gate structure, opposite the first side.

14. The method according claim 12, wherein the set of gate structures and the first set of regions of the first semiconductor structure are covered by a first spacer layer, wherein the first set of source/drain contact openings exposes portions of the first spacer layer that cover the first set of regions, and wherein the method further comprises removing the portions of the first spacer layer prior to forming the first set of source/drain contacts.

15. The method according to claim 12, wherein the set of gate structures and the second set of regions of the second semiconductor structure are covered by a first spacer layer, wherein the second set of source/drain contact openings exposes (i) portions of the first spacer layer that cover the second set of regions and (ii) portions of the first spacer layer that cover one or more sidewalls of the set of gate structures, wherein the method further comprises:
  removing the portions of the first spacer layer from the second set of regions and from the one or more sidewalls of the set of gate structures, wherein the one or more sidewalls of the set of gate structures form exposed sidewalls of the second set of source/drain contact openings; and thereafter
  after removing the portions of the first spacer layer, forming a contact spacer layer on the exposed sidewalls of the second set of source/drain contact openings.

16. The method according to claim 12, wherein the set of gate structures forms a set of sacrificial gate structures, and wherein the method further comprises replacing the set of sacrificial gate structures with a set of replacement gate structures subsequent to forming the second set of source/drain contacts and prior to forming the interconnection level.

17. The method according to claim 11, further comprising:
  subsequent to forming the second set of source/drain contact openings and prior to forming the second set of source/drain contacts, epitaxially growing a respective doped semiconductor top portion in each region of the second set of regions of the second semiconductor structure, wherein the level of the bottom surface of the first shallow portion of the first source/drain contact opening is located above a level of the doped semiconductor top portion on the first region of the second set of regions of the second semiconductor structure.

18. The method according to claim 11, further comprising:
  subsequent to forming the first set of source/drain contact openings and prior to forming the first set of source/drain contacts, epitaxially growing a respective doped semiconductor top portion in each region of the first set of regions.

19. The method according to claim 11, wherein forming the first set of source/drain contacts comprises depositing a contact material in the first set of source/drain openings, and wherein the method further comprises forming a capping layer on the first set of source/drain contacts.

20. The method according to claim 11, wherein the first semiconductor structure and the second semiconductor structure form part of a functional cell, wherein forming the interconnection level comprises forming the interconnection level to include a middle routing track extending in the first horizontal direction and arranged at a horizontal position halfway between the first and second semiconductor structures, and wherein the middle routing track abuts the first vertical via.

* * * * *